US012684976B2

(12) United States Patent
Wang et al.

(54) DISPLAY SUBSTRATE AND DISPLAY APPARATUS WITH FAN-OUT REGION INCLUDING TRANSFER LINE HAVING MAIN BODY AND CONNECTION ENDS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Mengqi Wang, Beijing (CN); Ziyang Yu, Beijing (CN); Zhiliang Jiang, Beijing (CN); Ming Hu, Beijing (CN); Fei Chen, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 446 days.

(21) Appl. No.: 18/549,608

(22) PCT Filed: Feb. 23, 2023

(86) PCT No.: PCT/CN2023/077861
§ 371 (c)(1),
(2) Date: Sep. 8, 2023

(87) PCT Pub. No.: WO2023/207291
PCT Pub. Date: Nov. 2, 2023

(65) Prior Publication Data
US 2025/0031537 A1 Jan. 23, 2025

(30) Foreign Application Priority Data

Apr. 25, 2022 (WO) ................ PCT/CN2022/089120
Jul. 25, 2022 (CN) .......................... 202210880462.1

(10) Patent No.: US 12,684,976 B2
(45) Date of Patent: Jul. 14, 2026

(51) Int. Cl.
*H10K 59/131* (2023.01)

(52) U.S. Cl.
CPC .................................. *H10K 59/131* (2023.02)

(58) Field of Classification Search
CPC .................................................... H10K 59/131
See application file for complete search history.

(56) References Cited

U.S. PATENT DOCUMENTS 10,126,853 B2 * 11/2018 Jin ........................ G02F 1/1339
2015/0187294 A1 * 7/2015 Chen .................... G09G 3/3685
345/98

(Continued)

FOREIGN PATENT DOCUMENTS

CN 105427787 A 3/2016
CN 108598142 A 9/2018

(Continued)

OTHER PUBLICATIONS

International Search Report and Written Opinion (w/ English translation) for corresponding PCT Application No. PCT/CN2023/085241, dated Jul. 1, 2023, 16 pages.

(Continued)

*Primary Examiner* — Lex H Malsawma
(74) *Attorney, Agent, or Firm* — Dority & Manning, P.A.

(57) ABSTRACT

A display substrate includes conductive layers including data lines, connection lines and fan-out lines. A connection line crosses at least one data line and is insulated from the crossed data line(s). A first fan-out line is electrically connected to the connection line, and a second fan-out line is electrically connected to an end of a second data line proximate to a fan-out region. The first fan-out line includes a transfer line. The fan-out region includes a first fan-out region and a second fan-out region, and the transfer line is located in the second fan-out region. The transfer line and (Continued)

second fan-out lines are located in different conductive layers, and crosses at least one second fan-out line. The transfer line includes a main body and two connection ends, and the main body is located on a side of the two connection ends proximate to the display region.

20 Claims, 9 Drawing Sheets

(56)                    References Cited

U.S. PATENT DOCUMENTS

| | | | |
|---|---|---|---|
| 2020/0183240 A1 | 6/2020 | Hsieh et al. | |
| 2020/0312252 A1 | 10/2020 | Jeong et al. | |
| 2021/0028261 A1 | 1/2021 | Lee et al. | |
| 2021/0126837 A1 | 4/2021 | Dinh et al. | |
| 2021/0225982 A1* | 7/2021 | Yi ........................ | H10K 59/131 |
| 2021/0273035 A1 | 9/2021 | Cho et al. | |
| 2022/0406875 A1 | 12/2022 | Zhang et al. | |
| 2023/0043145 A1 | 2/2023 | Yuan et al. | |
| 2023/0207572 A1 | 6/2023 | Ma et al. | |

FOREIGN PATENT DOCUMENTS

| | | |
|---|---|---|
| CN | 110286532 A | 9/2019 |
| CN | 111584475 A | 8/2020 |
| CN | 112599058 A | 4/2021 |
| CN | 113161401 A | 7/2021 |
| CN | 113436541 A | 9/2021 |
| CN | 214848636 U | 11/2021 |
| CN | 113964142 A | 1/2022 |
| CN | 114003143 A | 2/2022 |
| CN | 216286614 U | 4/2022 |
| CN | 115101575 A | 9/2022 |
| CN | 115188792 A | 10/2022 |
| CN | 115207073 A | 10/2022 |

OTHER PUBLICATIONS

International Search Report (w/ English translation) and Written Opinion for corresponding PCT Application No. PCT/CN2023/077861, dated May 30, 2023, 9 pages.

Chinese Office Action (w/ English translation) for corresponding Chinese Application No. 202210876068.0, dated Oct. 8, 2022, 16 pages.

Notification to Grant Patent Right for Invention (w/ English translation) for corresponding Chinese Application No. 202210876068.0, dated Oct. 18, 2022, 8 pages.

Notification to Grant Patent Right for Invention (w/ English translation) for corresponding Chinese Application No. 202210880462.1, dated Jul. 21, 2023, 8 pages.

Extended European Search Report for corresponding Application No. EP 23 79 472, dated Mar. 12, 2025, 5 pages.

Extended European Search Report for corresponding Application No. EP 23 79 4942, dated Mar. 12, 2025, 8 pages.

Extended European Search Report for corresponding Application No. EP23794727.0, dated Mar. 12, 2025, 5 pages.

Extended European Search Report for corresponding Application No. EP23794942.5, dated Mar. 12, 2025, 8 pages.

* cited by examiner

200

210

210

211

100

100

100

001

DISPLAY SUBSTRATE AND DISPLAY APPARATUS WITH FAN-OUT REGION INCLUDING TRANSFER LINE HAVING MAIN BODY AND CONNECTION ENDS

CROSS-REFERENCE TO RELATED APPLICATIONS

This application is a national phase entry under 35 USC 371 of International Patent Application No. PCT/CN2023/077861, filed on Feb. 23, 2023, which claims priorities to Chinese Patent Application No. 202210880462.1, filed on Jul. 25, 2022, and International Patent Application No. PCT/CN2022/089120, filed on Apr. 25, 2022, which are incorporated herein by reference in their entireties.

TECHNICAL FIELD

The present disclosure relates to the field of display technologies, and in particular, to a display substrate and a display apparatus.

BACKGROUND

At present, organic light-emitting diode (OLED) display apparatuses have been widely used due to their properties such as self-luminescence, fast response, high contrast ratio, wide viewing angle, and the fact that the display apparatuses are capable of being fabricated on flexible substrates.

The OLED display device includes sub-pixels, each sub-pixel includes a pixel driving circuit and a light-emitting device, and the pixel driving circuit drives the light-emitting device to emit light, thereby achieving display.

SUMMARY

In an aspect, a display substrate is provided. The display substrate has a display region and a fan-out region, and the fan-out region is adjacent to an edge of the display region. The display substrate includes a substrate and a plurality of conductive layers. The plurality of conductive layers are located on a same side of the substrate. The plurality of conductive layers are stacked. The plurality of conductive layers include: a plurality of data lines, a plurality of connection lines and a plurality of fan-out lines. The plurality of data lines are arranged at intervals along a first direction, and the plurality of data lines all extend along a second direction, the second direction intersecting the first direction; the plurality of data lines include a plurality of first data lines and a plurality of second data lines, the plurality of first data lines are located in two edge regions of the display region along the first direction, and the plurality of second data lines are located in a central region of the display region along the first direction. A a first end of a connection line is located in an edge region and is electrically connected to a first data line, and a second end of the connection line extends to a boundary between the central region and the fan-out region; at least one of the connection lines crosses at least one data line, and is insulated from the at least one data line that the at least one of the connection lines crosses; a second end of the at least one of the connection lines is located between two adjacent second data lines. The plurality of fan-out lines are located in the fan-out region; the plurality of fan-out lines include a plurality of first fan-out lines and a plurality of second fan-out lines; a first fan-out line is electrically connected to the second end of the connection line, and a second fan-out line is electrically connected to an end, proximate to the fan-out region, of a data line that is not electrically connected to the connection line. The display substrate further has a bending region and a chip on panel region that are sequentially away from the display region; the fan-out region includes a first fan-out region and a second fan-out region, the first fan-out region is located between the display region and the bending region, and the second fan-out region is located between the bending region and the chip on panel region. The first fan-out line includes a transfer line, and the transfer line is located in the second fan-out region; the transfer line crosses at least one of the second fan-out lines, so that an arrangement order of ends of the plurality of fan-out lines away from the display region along the first direction is the same as an arrangement order of the plurality of data lines along the first direction. The transfer line includes a main body and two connection ends, and the main body is located on a side of the two connection ends proximate to the display region.

In some embodiments, the display substrate further has a cell test region located between the bending region and the chip on panel region; and the second fan-out region is located between the cell test region and the chip on panel region.

In some embodiments, the transfer line is U-shaped or approximately U-shaped.

In some embodiments, a central axis of the display substrate extending along the second direction is defined as a first central axis; a region located on a side of the first central axis in the second fan-out region is a fan-out sub-region. In the fan-out sub-region, a plurality of transfer lines are arranged radially, and in two adjacent transfer lines, an outer transfer line is arranged around an inner transfer line.

In some embodiments, the two adjacent transfer lines are located in different conductive layers.

In some embodiments, a central axis of the display substrate extending along the second direction is defined as a first central axis; a region located on a side of the first central axis in the second fan-out region is a fan-out sub-region; in the fan-out sub-region: the first fan-out line further includes a first line segment and a second line segment that are sequentially away from the display region and electrically connected to each other; the first line segment is gradually close to the first central axis from an end thereof proximate to the display region to an end thereof away from the display region; the second line segment is parallel to the first central axis; the second fan-out line includes a third line segment and a fourth routing segment that are sequentially away from the display region and electrically connected to each other; the third line segment is gradually close to the first central axis from an end thereof proximate to the display region to an end thereof away from the display region; the fourth line segment is parallel to the first central axis. A connection end of the transfer line proximate to the first central axis is electrically connected to an end of the second line segment away from the first line segment.

In some embodiments, in the fan-out sub-region: a plurality of first line segments and a plurality of third line segments are alternately arranged; a fitting straight line defined by an end of the first line segment away from the display region and an end of the third line segment away from the display region is gradually close to the display region from an end thereof away from the first central axis to an end thereof proximate to the first central axis.

In some embodiments, in the fan-out sub-region: second line segments that are directly adjacent among the plurality of second line segments are in a same group; and ends, away from the display region, of the second line segments in the same group are staggered along the first direction.

In some embodiments, in the fan-out sub-region: in two adjacent second line segments, a length of a second line segment proximate to the first central axis is less than a length of a second line segment away from the first central axis; in two adjacent transfer lines, a connection end of a transfer line proximate to the first central axis for connecting a second line segment is closer to the display region related to a connection end of a transfer line away from the first central axis for connecting a second line segment.

In some embodiments, the main body includes a first transfer segment; the first transfer segment is connected to a connection end of the transfer line that is connected to the second line segment; an orthographic projection of the first transfer segment on the substrate overlaps or approximately overlaps with an orthographic projection of the corresponding connected second line segment on the substrate.

In some embodiments, the main body further includes a second transfer segment that is connected to the first transfer segment and a third transfer segment that is connected to the second transfer segment. The plurality of conductive layers further include an isolation block located on a side of the first line segment and the third line segment away from the substrate, and the isolation block covers the first line segment and the third line segment. The transfer line is located on a side of the isolation block away from the substrate; an orthographic projection of the second transfer segment on the substrate is located within an orthographic projection of the isolation block on the substrate; and orthographic projections of the first transfer segment and the third transfer segment on the substrate are located outside the orthographic projection of the isolation block on the substrate.

In some embodiments, the isolation block is electrically connected to a voltage signal line.

In some embodiments, the isolation block includes a first border, and the first border coincides or approximately coincides with a fitting straight line defined by an end of the first line segment away from the display region and an end of the third line segment away from the display region.

In some embodiments, the isolation block includes a second border, and the second border coincides or approximately coincides with a line segment farthest away from the first central axis among all first line segments and all third line segments.

In some embodiments, the isolation block includes the first border and the second border, and an angle between the first border and the second border is an obtuse angle.

In some embodiments, the orthographic projection of the isolation block on the substrate is triangular or approximately triangular.

In some embodiments, the plurality of conductive layers include at least two gate metal layers and at least two source-drain metal layers. The at least two source-drain metal layers are located on a side of the at least two gate metal layers away from the substrate. The first line segment, the second line segment, the third line segment and the fourth line segment are located in the at least two gate metal layers, and the isolation block is located in a source-drain metal layer close to the substrate in the at least two layer source-drain metal layers, and the transfer line is located in a source-drain metal layer far away from the substrate in the at least two source-drain metal layers.

In another aspect, a display apparatus is provided. The display apparatus includes the display substrate as described in any of the above embodiments.

BRIEF DESCRIPTION OF THE DRAWINGS

In order to describe technical solutions in the present disclosure more clearly, the accompanying drawings to be used in some embodiments of the present disclosure will be introduced briefly. However, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
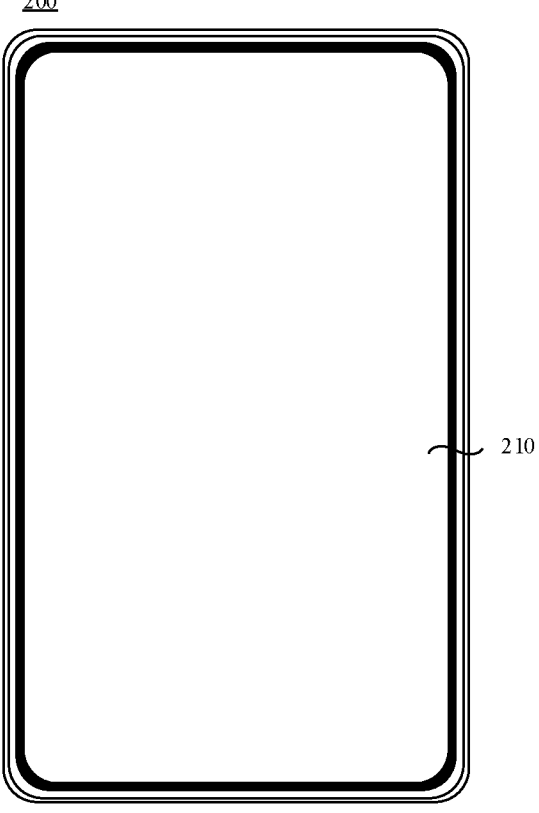
FIG. 1 is a structural diagram of a display apparatus, in accordance with some embodiments.

The technical solutions in some embodiments of the present disclosure will be described clearly and completely with reference to the accompanying drawings. However, the described embodiments are merely some but not all embodiments of the present disclosure. All other embodiments obtained by a person of ordinary skill in the art based on embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "example," "specific example," or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

The terms "first" and "second" are used for descriptive purposes only, and are not to be construed as indicating or implying a relative importance or implicitly indicating a number of indicated technical features. Thus, features defined by "first" and "second" may explicitly or implicitly include one or more of the features. In the description of the embodiments of the present disclosure, the term "multiple", "a plurality of" or "the plurality of" means two or more unless otherwise specified.

The use of "applicable to" or "configured to" herein means an open and inclusive expression, which does not exclude devices that are applicable to or configured to perform additional tasks or steps.

In additional, the phase "based on" used herein is meant to be open and inclusive, in that a process, step, calculation, or other action "based on" one or more stated conditions or values may, in practice, be based on additional conditions or values beyond those stated.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views that are schematic illustrations of idealized embodiments. In the accompanying drawings, thicknesses of layers and areas of regions are enlarged for clarity. Variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature being curved. Therefore, the regions shown in the accompanying drawings are schematic in nature, and their shapes are not intended to show actual shapes of the regions in a device, and are not intended to limit the scope of the exemplary embodiments.

FIG. 1 is a structural diagram of a display apparatus, in accordance with some embodiments.

As shown in FIG. 1, some embodiments of the present disclosure provide a display apparatus 200. It can be understood that the display apparatus 200 is a product having an image display function. For example, the display apparatus 200 may be used to display still images, such as pictures or photos. The display apparatus 200 may also be used to display dynamic images, such as videos or game images.

In some examples, the display apparatus 200 may be a notebook computer, a mobile telephone, a wireless device, a personal digital assistant (PDA), a hand-held or portable computer, a global positioning system (GPS) receiver/navigator, a camera, an MPEG-4 Part 14 (MP4) video player, a video camera, a game console, a watch, a clock, a calculator, a television (TV) monitor, a flat-panel display, a computer monitor, a car display (e.g., an odometer display), a navigator, a cockpit controller and/or display, a camera view display (e.g., a rear view camera display in a vehicle), an electronic photo, an electronic billboard or sign, a projector, a packaging and aesthetic structure (e.g., a display for displaying an image of a piece of jewelry), and the like.

The display apparatus 200 includes a display panel 210. In some examples, the display panel 210 is an organic light-emitting diode (OLED) display or a quantum dot light-emitting diode (QLED) display.

In addition, the display apparatus 200 may also include an under-screen camera and an under-screen fingerprint recognition sensor, so that the display apparatus can realize various functions such as photographing, video recording, fingerprint recognition or face recognition.

Figure 2:
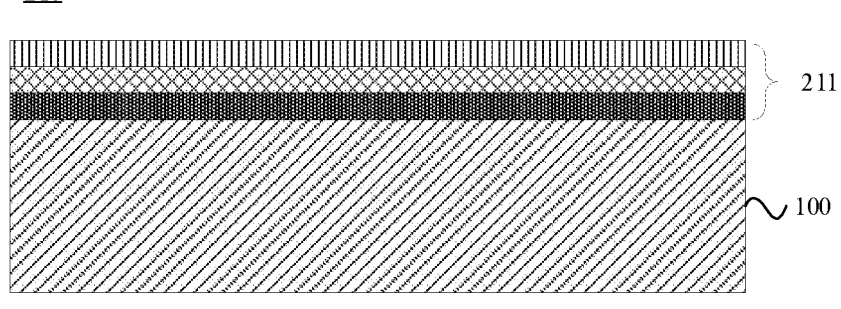
FIG. 2 is a structural diagram of a display panel, in accordance with some embodiments.

FIG. 2 is a structural diagram of a display panel, in accordance with some embodiments.

The display panel 210 includes a display substrate 100. For example, as shown in FIG. 2, the display panel 210 may further include other functional film layers 211 (such as a touch functional layer, an anti-reflection layer, an anti-fingerprint layer, a hardening layer, and an encapsulation cover plate) located on a display side of the display substrate 100, so that the display panel 210 can realize different functions.

The embodiments of the present disclosure do not limit other functional film layers 211 of the display panel 210. The display structure 100 will be exemplarily described below.

Figure 3:
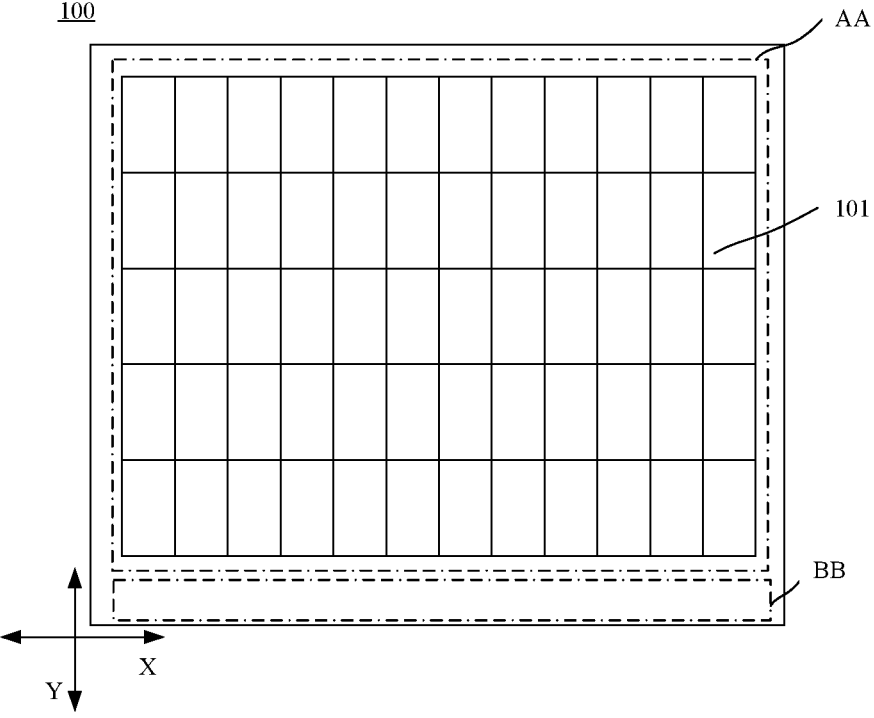
FIG. 3 is a structural diagram of a display substrate, in accordance with some embodiments.

FIG. 3 is a structural diagram of a display substrate, in accordance with some embodiments.

In some examples, as shown in FIG. 3, the display substrate 100 includes a plurality of sub-pixels 101. The plurality of sub-pixels 101 are arranged in a plurality of columns along a first direction X, and arranged in a plurality of rows along a second direction Y. In some examples, the first direction X and the second direction Y intersect. For example, the first direction X is perpendicular to the second direction Y. In some examples, the first direction X is a horizontal direction, and the second direction Y is a vertical direction.

It can be understood that the sub-pixel 101 is the smallest unit for image display of the display substrate 100. Each sub-pixel 101 is capable of emitting light of a single color such as red, green or blue. The display substrate 100 may include a plurality of red sub-pixels, a plurality of green sub-pixels and a plurality of blue sub-pixels. By adjusting brightness (gray scales) of sub-pixels 101 of different colors, red light, green light and blue light of different intensities may be obtained. At least two of the red light, the green light and the blue light of different intensities are superimposed, and thus light of more colors may be displayed, thereby realizing full-color display of the display substrate 100.

It can be understood that, as shown in FIG. 3, the display substrate 100 has a display region AA and a fan-out region BB, and the fan-out region BB is adjacent to an edge of the display region AA. The display region AA is used to display image information, and the plurality of sub-pixels 101 are located in the display region AA of the display substrate 100.

It should be noted that the fan-out region BB is adjacent to an edge of the display region AA, that is, an edge of the fan-out region BB proximate to the display region AA coincides with an edge of the display region AA proximate to the fan-out region BB. In the accompanying drawings of the present disclosure, considering FIG. 3 as an example, the edge of the fan-out region BB is separated from the edge of the display region AA, which is only for the convenience of showing the display region AA and the fan-out region BB and dose not limit the display region AA and the fan-out region BB.

In some examples, as shown in FIG. 3, the fan-out region BB is located on a side of the display region AA along the second direction Y.

In some examples, as shown in FIG. 3, the fan-out region BB is adjacent to a lower edge of the display region AA. That is, the fan-out region BB is located below the display region AA along the second direction Y. For example, when the display apparatus 200 is used in a state perpendicular to or approximately perpendicular to the ground, the fan-out region BB is closer to the ground than the display region AA.

In some examples, each sub-pixel 101 includes a light-emitting device 300 and a pixel driving circuit, and the pixel driving circuit is electrically connected to the light-emitting device 300 and used for driving the light-emitting device 300 to emit light.

Figure 4:
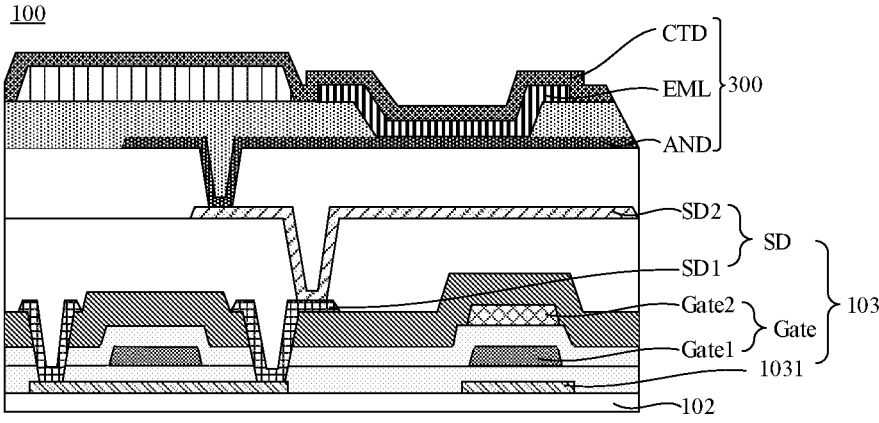
FIG. 4 is a structural diagram showing a connection structure between a light-emitting device and a pixel driving circuit in a sub-pixel.

FIG. 4 is a schematic diagram showing a connection structure between a light-emitting device and a pixel driving circuit in a sub-pixel.

In some examples, as shown in FIG. 4, the display substrate 100 includes a substrate 102 and a plurality of conductive layers 103. The plurality of conductive layers 103 are disposed on the same side of the substrate 102. The plurality of conductive layers 103 are stacked.

In some examples, the substrate 102 is made of a flexible material, so that the display substrate 100 can be bent. Therefore, the display panel 210 can realize functions such as curved surface display, folding display, or sliding and scrolling display. In some other examples, the substrate 102 is made of a rigid material.

For example, a material of the substrate 102 may be any one of polyimide (PI), polycarbonate (PC) or polyvinyl chloride (PVC).

In some examples, insulating layer(s) (such as a gate insulating layer, a buffer layer, a passivation layer, an organic layer, etc.) may be disposed between the plurality of conductive layers 103, so as to electrically isolate adjacent two conductive layers 103.

For example, the pixel driving circuit is disposed in the plurality of conductive layers 103. In some examples, as shown in FIG. 4, the plurality of conductive layers 103 include an active film layer 1031, at least one gate metal layer Gate (such as a first gate metal layer Gate1, a second gate metal layer Gate2 and a third gate metal layer (which is not shown in the figure and may be located between the second gate metal layer Gate2 and a first source-drain metal layer SD1)), and at least one source-drain metal layer (such as the first source-drain metal layer SD1, a second source-drain metal layer SD2 and a third source-drain metal layer (which is not shown in the figure and may be located between the second source-drain metal layer SD2 and an anode layer AND)) that are sequentially arranged away from the substrate 102.

For example, a material of any gate metal layer Gate may include a molybdenum material. Any source-drain metal layer may include a titanium/aluminum/titanium composite stacked structure.

The pixel driving circuit includes a plurality of thin film transistors (TFTs) and at least one capacitor. For example, the active film layer 1031 and the first gate metal layer Gate1 may be used to form a part of thin film transistors (one, two or more thin film transistors) among the plurality of thin film transistors, and the active film layer 1031 and the second gate metal layer Gate2 may be used to form another part thin film transistors (one, two or more thin film transistors) among the plurality of thin film transistors. The first gate metal layer Gate1 and the second gate metal layer Gate2 may be used to form the at least one capacitor.

It should be noted that the number of active film layers 1031 is not limited here. For example, some embodiments of the present disclosure may only include one active film layer 1031, and a material of the active film layer 1031 may include a metal oxide or a low temperature polysilicon. Alternatively, some embodiments of the present disclosure may also include two active film layers 1031, a material of one active film layer 1031 includes a metal oxide, and a material of the other active film layer includes a low temperature polysilicon.

It can be known from the above embodiments, the display substrate 100 further includes the light-emitting device 300, and the pixel driving circuit is electrically connected to the light-emitting device 300. With continued reference to FIG. 4, the light-emitting device 300 will be exemplarity described below.

In some examples, the light-emitting device 300 is located on a side of the plurality of conductive layers 103 away from the substrate 102. For example, the light-emitting device 300 includes a anode layer AND, a part of a light-emitting layer EML and a cathode layer CTD that are sequentially arranged in a direction away from the substrate 102.

In some examples, the light-emitting layer EML includes a plurality of effective light-emitting portions arranged at intervals. It can be understood that the effective light-emitting portions are used for emitting light. For example, a material of the effective light-emitting portion includes an electroluminescent material. It can be understood that electroluminescence refers to a phenomenon that organic semi-conductor materials are driven by an electric field to form excitons through carrier injection, transporting, and electron and hole combination, and then emit light due to radiative recombination.

It can be understood that a part of the plurality of effective light-emitting portions is used to emit red light, another part of the plurality of effective light-emitting portions is used to emit green light, and yet another part of the plurality of effective light-emitting portions is used to emit blue light. For example, different electroluminescent materials may be selected, so that the effective light-emitting portions can emit light of different colors. It can be understood that the number of effective light-emitting portions that emit red light, the number of effective light-emitting portions that emit green light, and the number of effective light-emitting portions that emit blue light may be the same or different.

For example, effective light-emitting portions that emit red light, effective light-emitting portions that emit green light, and effective light-emitting portions that emit blue light may be mixed and arranged in an array. In this way, by controlling the light-emitting intensities of different effective light-emitting portions, it is possible to obtain red light, green light and blue light of different intensities. Mixing red light, green light and blue light of different intensities may make the display substrate 100 display color images.

It can be understood that the pixel driving circuit can drive the light-emitting layer EML to emit light. In some examples, a pixel driving circuit is electrically connected to an effective light-emitting portion through an anode layer AND, so that each pixel driving circuit can provide a driving current to a respective effective light-emitting portion through an anode layer AND. In this way, the plurality of effective light-emitting portions emit light independently, thereby reducing the mutual interference between the plurality of effective light-emitting portions, and improving the display effect of the display substrate 100. It can be understood that by adjusting a magnitude of the driving current provided by the pixel driving circuit to the effective light-emitting portion, the light-emitting brightness of the effective light-emitting portion can be adjusted.

In some examples, the anode layer AND is made of a metal material, such as copper or silver. The cathode layer CTD is made of a transparent material, such as indium tin oxide ITO) or indium zinc oxide (IZO) that is transparent, so that light emitted by the effective light-emitting portions can exit through the cathode layer CTD. In this case, the display substrate 100 is a top-emission display substrate.

In some other examples, the anode layer AND is made of a transparent material, such as ITO or IZO; and the cathode layer CTD is made of a metal material, such as copper or silver. Thus, the light emitted by the effective light-emitting portion can exit through the anode layer AND. In this case, the display substrate 100 is a bottom-emission display substrate.

In some other examples, both the anode layer AND and the cathode layer CTD are made of transparent materials, such as ITO or IZO. Thus, the light emitted by the effective light-emitting portion can exit through the anode layer AND and the cathode layer CTD. In this case, the display substrate 100 is a double-sided-emission display substrate.

In some examples, in consideration of work function, the material of the anode layer AND includes ITO, or a stack of ITO-Ag-ITO, so that the anode layer AND can provide more holes. The material of the cathode layer CTD includes magnesium (Mg) and silver (Ag), so that the cathode layer CTD can provide more electrons. The cathode layer CTD has a small thickness and can transmit light, so that the display substrate 100 can realize top emission.

In some examples, along a direction from the anode layer AND to the effective light-emitting portion, at least one of a hole injection layer (HIL), a hole transporting layer (HTL) and an electron blocking layer (EBL) is provided between the anode layer AND and the effective light-emitting portion. Along a direction from the cathode layer CTD to the effective light-emitting portion, at least one of an electron injection layer (EIL), an electron transporting layer (ETL) and a hole blocking layer (HBL) is provided between the cathode layer CTD and the effective light-emitting portion. In this way, the light-emitting reliability of the effective light-emitting portion is improved.

Figure 5:
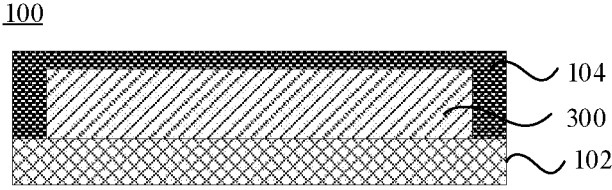
FIG. 5 is a structural diagram of another display substrate, in accordance with some embodiments.

FIG. 5 is a structural diagram of a display substrate, in accordance with some other embodiments.

In some examples, as shown in FIG. 5, the display substrate 100 further includes an encapsulation layer 104. The encapsulation layer 104 is located on a side of the light-emitting device 300 away from the substrate 102, and can cover the light-emitting device 300, so as to wrap the light-emitting device 300, which prevents water vapor and oxygen in an external environment from entering the light-emitting device 300 and protects the light-emitting device 300.

Figure 6:
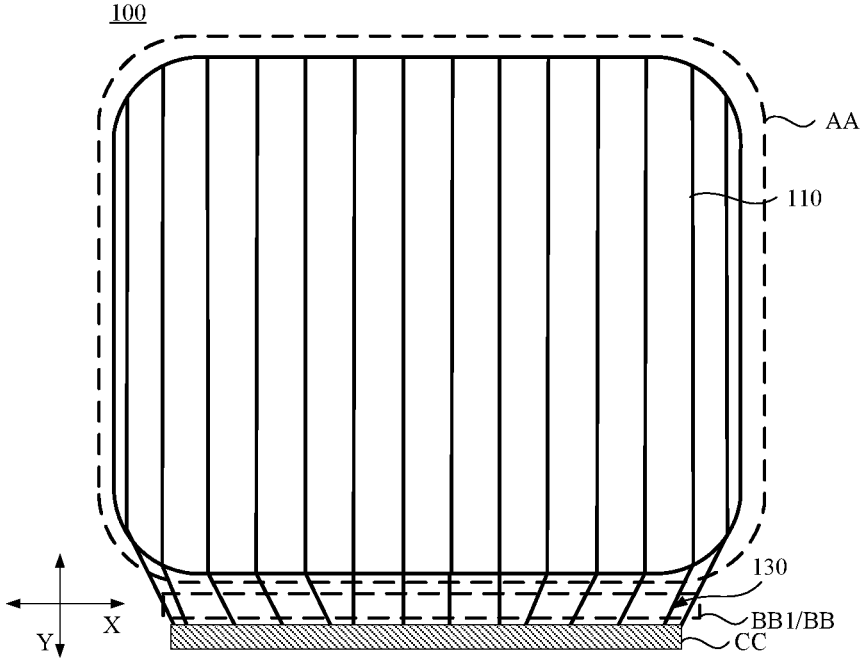
FIG. 6 is a structural diagram of yet another display substrate, in accordance with some embodiments.

FIG. 6 is a structural diagram of a display substrate, in accordance with yet some other embodiments.

In some embodiments, in some examples, as shown in FIG. 6, the plurality of conductive layers 103 include the pixel driving circuits, and further include a plurality of data lines 110 and a plurality of fan-out lines 130. It can be understood that the plurality of data lines 110 are located in the display region AA, are electrically connected to the plurality of pixel driving circuits, and are used to transmit driving signals to the pixel driving circuits, so that the pixel driving circuits can drive the light-emitting devices 300 to emit light to realize the display of different gray scales. The plurality of fan-out lines 130 are located in the fan-out region BB, and are electrically connected to the plurality of data lines 110 in one-to-one correspondence.

For example, as shown in FIG. 6, the plurality of data lines 110 are arranged at intervals along a first direction X, and the plurality of data lines 110 all extend along a second direction Y The second direction Y and the first direction X intersect, and the first direction X and the second direction Y may both be parallel to the substrate 102.

For example, the first direction X and the second direction Y are perpendicular to or approximately perpendicular to each other. For example, as shown in FIG. 6, the first direction X is a horizontal direction, and the second direction Y is a vertical direction.

It can be seen from the above that, as shown in FIG. 3, the plurality of sub-pixels 101 are arranged in a plurality of columns along the first direction X, and are arranged in a plurality of rows along the second direction Y. That is, the pixel driving circuits in the plurality of sub-pixels 101 can be arranged in an array of a plurality of rows and a plurality of columns along the first direction X and the second direction Y. As shown in FIG. 6, the plurality of data lines 110 extend along the second direction Y. In this way, one data line 110 can be electrically connected to pixel driving circuits in a single column of sub-pixels 101 arranged along the second direction Y, so as to supply a data voltage to the pixel driving circuits in the single column of sub-pixels 101.

In some examples, distances between the plurality of data lines 110 along the first direction X are the same or approximately the same.

It can be understood that, as shown in FIG. 6, the fan-out region BB is adjacent to an edge of the display region AA along the second direction Y. Therefore, by arranging the plurality of data lines 110 extending along the second direction Y, the plurality of data lines 110 can be electrically connected to the plurality of fan-out lines 130 located in the fan-out region BB in a one-to-one correspondence.

For example, as shown in FIG. 6, the plurality of fan-out lines 130 located in the fan-out region BB gradually approach and converge, and extend to a side of the fan-out region BB away from the display region AA, which facilitates an electrical connection between the plurality of fan-out lines 130 and an external driver chip (integrated circuit (IC)) of the display substrate 100. It can be understood that the driver IC can input signals to the pixel driving circuits through the plurality of fan-out lines 130 and the plurality of data lines 110.

In some examples, edges of the plurality of fan-out lines 130 away from the display region AA extend to an edge of the fan-out region BB away from the display region AA, so that the plurality of fan-out lines 130 can be electrically connected to the driver IC.

However, in the above implementation, a space occupied by the plurality of fan-out lines 130 along the second direction Y may be increased. As a result, a width of the fan-out region BB is increased, that is, a width of a side frame (such as a lower frame) of the display panel 210 is increased, which is not conducive to the narrow frame of the display panel 210, and affects the visual effect of the display panel 210.

In some examples, the plurality of fan-out lines 130 are located in at least one gate metal layer Gate (e.g., the first gate metal layer Gate1, the second gate metal layer Gate2 and the third gate metal layer). The material of the gate metal layer Gate includes a molybdenum material, and the molybdenum material has a high resistance. On this basis, as shown in FIG. 6, lengths of fan-out lines 130 located at two ends along the first direction X regions are relatively long, resulting in relatively large resistances of data lines 110 located at two ends along the first direction X, which facilitates the reduction of the display brightness of two ends of the display substrate 100 along the first direction X. Moreover, as shown in FIG. 6, since the lengths of the fan-out lines 130 located at the two ends along the first direction X are significantly greater than lengths of the fan-out lines 130 located at the middle along the first direction X, it will also cause the increasing of the resistance difference between the data lines 110 located at the two ends along the first direction X and data lines 110 located at the middle along the first direction X. Therefore, a situation that the display brightness of the display substrate 100 at the middle along the first direction X is greater than the display brightness of the display substrate 100 at the two ends along the first direction X is easy to occur, which affects the brightness uniformity of the display image of the display substrate 100.

Figure 7:
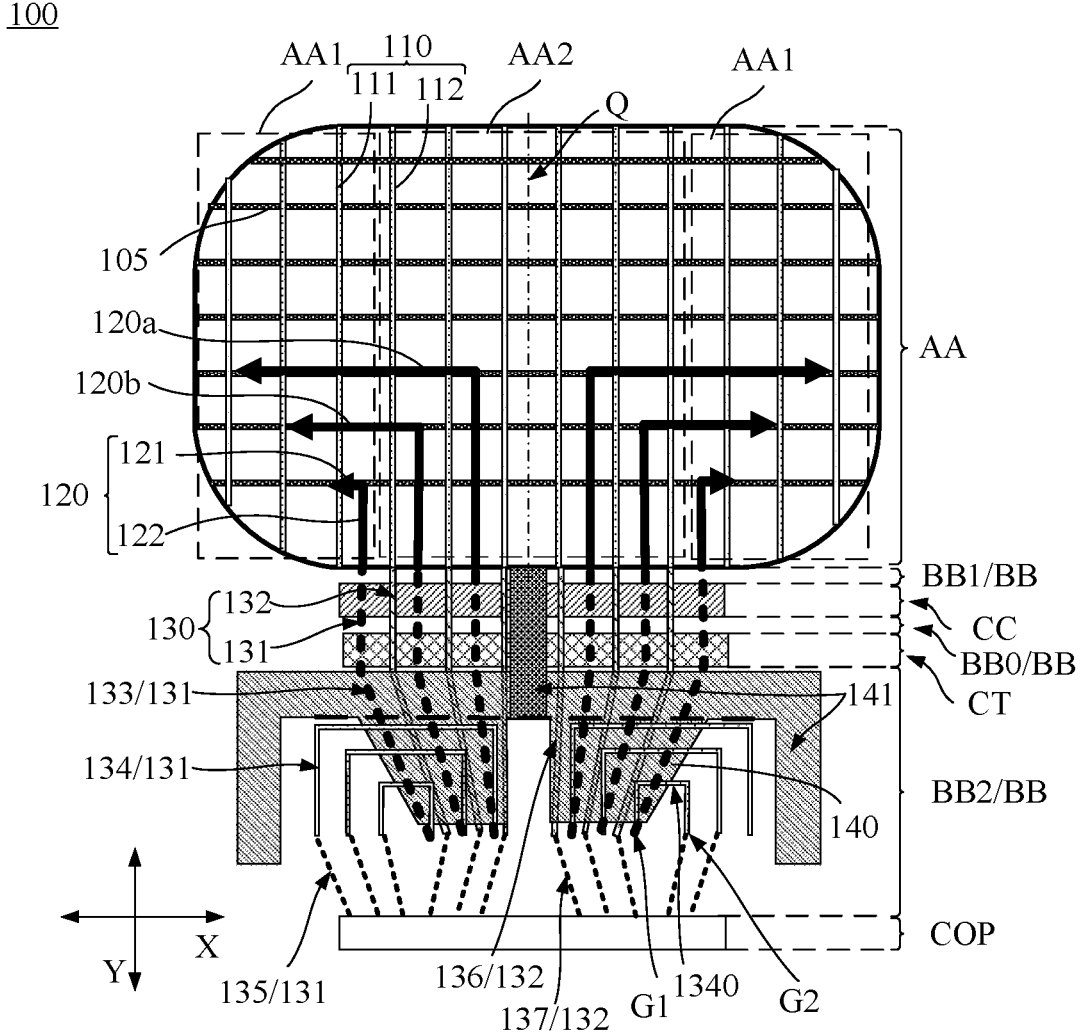
FIG. 7 is a structural diagram of yet another display substrate, in accordance with some embodiments.

FIG. 7 is a structural diagram of a display substrate, in accordance with yet some other embodiments.

Some embodiments of the present disclosure provide a display substrate 100, and as shown in FIG. 7, the display substrate 100 has a display region AA and a fan-out region BB. The fan-out region BB is adjacent to an edge of the display region AA. The display substrate 100 includes a substrate 102 and a plurality of conductive layers 103 (as shown in FIG. 4). The plurality of conductive layers 103 are located on the same side of the substrate 102, and the plurality of conductive layers 103 are stacked. The plurality of conductive layers 103 include a plurality of data lines 110. The plurality of data lines 110 are arranged at intervals along a first direction X, and the plurality of data lines 110 all extend along a second direction Y; and the first direction X and the second direction Y intersect.

It should be noted that, the above-mentioned embodiments of the present disclosure have illustrated the display region AA, the fan-out region BB, the substrate 102, the plurality of conductive layers 103, and the plurality of data lines 110, and details will not be repeated here. In addition, referring to FIG. 7, the display substrate 100 may further include a plurality of scan control signal lines 105, and the plurality of scan control signal lines 105 are arranged at intervals along the second direction Y and extend along the first direction X. In this way, a single scan control signal line 105 can be electrically connected to pixel driving circuits in a single row of sub-pixels 101 arranged along the first direction X, so as to control the working state of the pixel driving circuits in the single row of sub-pixels 101.

With continued reference to FIG. 7, the display substrate 100 provided in the embodiments of the present disclosure will be schematically described below.

In some examples, as shown in FIG. 7, the plurality of data lines 110 include a plurality of first data lines 111 and a plurality of second data lines 112. The plurality of first data lines 111 are located in two edge regions AA1 of the display region AA along the first direction X, and the plurality of second data lines 112 are located in a central region AA2 of the display region AA along the first direction X.

For example, as shown in FIG. 7, there are two edge regions AA1, and the two edge regions AA1 are located on two sides of the display substrate 100 along the first direction X; and the central region AA2 is located between the two edge regions A11 along the first direction X.

For example, the number of the first data lines 111 and the number of the second data lines 112 may be the same or different. Moreover, the numbers of first data lines 111 located in the two edge regions AA1 may be the same or different.

It should be noted that, in the embodiments of the present disclosure, the first data lines 111 and the second data lines 112 are only used to distinguish the data lines 110 located in the edge regions AA1 and the central region AA2, and do not further limit other aspects of the data lines 110.

For example, along the first direction X, widths of the two edge regions AA1 of the display region AA are the same or approximately the same. In some examples, as shown in FIG. 7, the display region AA includes rounded corners. That is, two adjacent edges of the display region AA are connected by an arc-shaped structure or an approximate arc-shaped structure. The rounded corners are located in the edge regions AA1 of the display region AA. For example, a width of the edge region AA1 in the first direction X may be greater than or equal to a width of the rounded corner in the first direction X.

For example, the plurality of first data lines 111 and the plurality of second data lines 112 are located in the same conductive layer 103. For example, the plurality of first data lines 111 and the plurality of second data lines 112 are located in the first source-drain metal layer SD1. For another example, the plurality of first data lines 111 and the plurality of second data lines 112 are located in the second source-drain metal layer SD2. For another example, the plurality of first data lines 111 and the plurality of second data lines 112 may also be located in other conductive layer 103 (e.g., the third source-drain metal layer) other than the first source-drain metal layer SD1 and the second source-drain metal layer SD2.

As shown in FIG. 7, the plurality of conductive layers 103 further include a plurality of connection lines 120. A first end of a connection line 120 (i.e., the arrow end in FIG. 7) is located in an edge region AA1 of the display region AA, and is electrically connected to a first data line 111. A second end of the connection line 120 (i.e., the end opposite to the arrow end in FIG. 7) extends to a boundary between the central region AA2 of the display region AA and the fan-out region BB.

For example, as shown in FIG. 7, the second end of any connection line 120 among the plurality of connection lines 120 extends to the central region AA2 of the display region AA.

It can be seen from the above that an edge of the display region AA proximate to the fan-out region BB may coincide with an edge of the fan-out region BB proximate to the display region AA. The second end of the connection line 120 extends to the boundary between the central region AA2 and the fan-out region BB. It can be understood that, the second end of the connection line 120 may be located on a boundary line between the central region AA2 and the fan-out region BB. Alternatively, the second end of the connection line 120 may have a small gap, e.g., a gap of several microns, from the boundary line, in this case, the second end of the connection line 120 may be located on a side of the boundary line proximate to the display region AA or on a side of the boundary line proximate to the fan-out region BB.

As shown in FIG. 7, at least one connection line 120 crosses at least one data line 110 (for example, a first data line 111 and/or a second data line 112), and is insulated from the data line(s) 110 that the at least one connection line 120 crosses.

It can be understood that, since the plurality of data lines 110 are arranged at intervals along the first direction X, second ends of some connection lines 120 need to cross at least one data line 110 when extending to the boundary between the central region AA2 and the fan-out region BB. For example, the at least one connection line 120 may cross both the first data line 111 and the second data line 112. For another example, the at least one connection line 120 may cross only the first data line 111 (not shown in the figures). For another example, the at least one connection line 120 may cross only the second data line 112 (not shown in the figures).

In addition, with reference with FIG. 7, the display substrate 100 may also include connection lines 120 that cross no data line 110, e.g., the first of the connection lines 120 and the last of the connection lines 120 from left to right along the first direction X in FIG. 7.

It can be understood that the connection line 120 crosses at least one data line 110. That is, an orthographic projection of the connection line 120 on the substrate 102 intersects an orthographic projection of the at least one data line 110 on the substrate 102.

In some examples, the connection lines 120 and the data lines 110 are located in different conductive layers 103, so that the connection lines 120 can be insulated from data lines 110 that the connection lines 120 cross.

For example, the data lines 110 are located in the first source-drain metal layer SD1, and the connection lines 120 are located in the second source-drain metal layer SD2. Alternatively, the data lines 110 are located in the second source-drain metal layer SD2, and the connection lines 120 are located in the third source-drain metal layer.

For example, when the connection lines 120 and the data lines 110 are located in different conductive layers 103, the first end of the connection line 120 may be electrically connected to the first data line 111 through a transfer hole. It can be understood that the transfer hole penetrates an insulating film layer between two adjacent conductive layers 103 in a direction perpendicular to or approximately perpendicular to the substrate 102, so that different conductive layers 103 can be electrically connected, which means that conductive lines located in different conductive layers 130 (e.g., the connection lines 120 and the data lines 110) can be electrically connected. For example, when two conductive layers 103 are not adjacent, conductive lines located in different conductive layers 130 may be electrically connected through a plurality of transfer holes.

For example, for the convenience of description, a transfer hole electrically connecting a conductive line in the first source-drain metal layer SD1 and a conductive line in the second source-drain metal layer SD2 may be referred to as a PLN1 hole, and a transfer hole electrically connecting a conductive line in the second source-drain metal layer SD2 and a conductive line in the third source-drain metal layer may be referred to as a PLN2 hole.

That is, when the first data lines 111 are located in the first source-drain metal layer SD1 and the connection lines 120 are located in the second source-drain metal layer SD2, the first end of the connection line 120 is electrically connected to the first data line 111 through the PLN1 hole. When the first data lines 111 are located in the second source-drain metal layer SD2 and the connection lines 120 are located in the third source-drain metal layer, the first end of the connection line 120 is electrically connected to the first data line 111 through the PLN2 hole.

It can be seen from the above that, in some examples, the connection lines 120 and the data lines 110 are located in different conductive layers 103, so that the connection lines 120 can be insulated from the data lines 110 that the connection lines 120 cross. In some other examples, the connection line 120 includes a main portion and a jumper portion. The main portion and the jumper portion may be electrically connected through a transfer hole. The main portion may be located in the same conductive layer 103 as the data line 110, and the jumper portion and the data line 110 may be located in different conductive layers 103. Thus, the jumper portion can cross at least one data line 110, and is insulated from connected with the data line(s) 110 that the jumper portion crosses.

As shown in FIG. 7, an second end of at least one connection line 120 is located between two adjacent second data lines 110. That is, a second end of one connection line 120 may be arranged between two adjacent second data lines 112, or second ends of two or more connection lines 120 may be arranged between two adjacent second data lines 112.

It can be understood that, as shown in FIG. 7, there may be a second end of one connection line 120, or second ends of two or more connection lines 120, or no second end of the connection line 120 between any group of two adjacent second data lines 112. The numbers of second ends of connection lines 120 arranged between different two adjacent second data lines 112 may be the same or different.

As shown in FIG. 7, the second end of the connection line 120 is arranged between two adjacent second data lines 112, so that the second end of the connection line 120 can pass through a gap between the two adjacent second data lines 112 to extend to the boundary between the central region AA2 and the fan-out region BB.

It can be understood that the number of the connection lines 120 and the number of the first data lines 110 may be the same or different. In some examples, the number of the connection lines 120 is the same as the number of the first data lines 110. The plurality of connection lines 120 are connected to the plurality of first data lines 111 in a one-to-one correspondence. In some other examples, the number of connection lines 120 is less than the number of first data lines 111; at this time, all connection lines 120 may be connected to a part of the first data lines 111 in one-to-one correspondence, and another part of the first data lines 111 may be connected to no connection line 120.

In some examples, as shown in FIG. 7, the connection line 120 includes a first connection sub-line 121 and a second connection sub-line 122. An end of the first connection sub-line 121 is located in the edge region AA1, and is electrically connected to the first data line 111. Another end of the first connection sub-line 121 extends to the central region AA2. An end of the second connection sub-line 122 is electrically connected to an end of the first connection sub-line 121 away from the first data line 111, and another end of the second connection sub-line 122 extends to the boundary between the central region AA2 and the fan-out region BB. For example, the first connection sub-line 121 extends along the first direction X, the second connection sub-line 122 extends along the second direction Y, and the first connection sub-line 121 and the second connection sub-line 122 are perpendicular or approximately perpendicular to each other.

It can be seen from the above that, in some examples, the connection line 120 includes the main portion and the jumper portion. For example, as shown in FIG. 7, when the connection line 120 includes the first connection sub-line 121 and the second connection sub-line 122, the second connection sub-line 122 may be used as the main portion, and the main portion and the plurality of data lines 110 are located in the same conductive layer 103; and the first connection sub-line 121 is used as the jumper portion, and the jumper portion and the plurality of data lines 110 are located in different conductive layers 103. The first connection sub-line 121 can cross at least one data line 110, and is insulated from the data line(s) 110 that the first connection sub-line 121 crosses. In addition, in some other examples, the second connection sub-line 122 may be used as the main portion, and the first connection sub-line 121 includes both a main portion and a jumper portion, and the jumper portion is used to cross the data line(s) 110.

In some examples, the jumper portion is farther away from the substrate 102 relative to the plurality of data lines 110, which may reduce parasitic capacitance created between the jumper portion and the gate metal layer Gate (e.g., the first gate metal layer Gate1, the second gate metal layer Gate2 and the third gate metal layer) and improves the reliability of signal transmission.

As shown in FIG. 7, the plurality of conductive layers 103 further includes a plurality of fan-out lines 130. The plurality of fan-out lines 130 are located in the fan-out region BB. The plurality of fan-out lines 130 includes a plurality of first fan-out lines 131 and a plurality of second fan-out lines 132. The first fan-out line 131 is electrically connected to the second end of the connection line 120, and the second fan-out line 132 is electrically connected to an end of the second data line 112 proximate to the fan-out region BB.

It should be noted that since the data lines 110 and the connection lines 120 may both be located in the display region AA, when the fan-out lines 130 and the data lines 110 (or the connection lines 120) are arranged in different layers and are electrically connected to each other, their transfer connection positions may be located in the display region AA. In this case, it may still be considered that the fan-out lines 130 satisfy the condition of being located in the fan-out region BB.

The number of the first fan-out lines 131 is the same as the number of the connection lines 120, so that the plurality of first fan-out lines 131 can be electrically connected to the plurality of connection lines 120 in one-to-one correspondence. The number of the second fan-out lines 132 and the number of the second data lines 112 is the same or different.

For example, in a case where all the first data lines 111 are electrically connected to the plurality of connection lines 120 in one-to-one correspondence, the number of the second fan-out lines 132 is the same as the number of the second data lines 112, and the plurality of second fan-out lines 132 are electrically connected to the plurality of second data lines 112 in one-to-one correspondence.

However, in a case where a part of first data lines 111 among all the first data lines 111 are electrically connected to the plurality of connection lines 120 in one-to-one correspondence (that is, when the number of the first data lines 111 is greater than the number of the connection lines 120), the number of the second fan-out lines 132 is different from the number of the second data lines 112. In this case, a part of second fan-out lines 132 (two or more second fan-out lines 132) among the plurality of second fan-out lines 132 are electrically connected to the second data lines 112 in one-to-one correspondence, and another part of second fan-out lines 132 (two or more second fan-out lines 132) among the plurality of second fan-out lines 132 may be electrically connected to first data lines 111 that are electrically connected to no connection line 120 in one-to-one correspondence.

It can be understood that the number of the fan-out lines 130 (including the first fan-out lines 131 and the second fan-out lines 132) may be the same as the number of the data lines 110 (including the first data lines 111 and the second data lines 112). A signal output by the driver IC can be transmitted through a fan-out line 130 to a data line 110 electrically connected to the fan-out line 130, so as to drive a corresponding column of sub-pixels 101.

For example, as shown in FIG. 7, a central axis of the display substrate 100 extending along the second direction Y is defined as a first central axis Q. That is, the first central axis Q is located at the center of the display substrate 100 along the first direction X, and is parallel to the substrate

102. It can be understood that the first central axis Q is a virtual reference line, and the first central axis Q is located in the central region AA2 of the display substrate 100.

It can be understood that, as shown in FIG. 7, since the second end of the connection line 120 extends to the boundary between the central region AA2 and the fan-out region BB, the plurality of first fan-out lines 131 can be electrically connected to the second ends of the connection lines 120 at positions more approximate to the first central axis Q of the display substrate 100.

In this way, it can reduce the space occupied by the plurality of fan-out lines 130 along the second direction Y when the plurality of fan-out lines 130 in the fan-out region BB gather and extend in a direction away from the display region AA. Therefore, the width of the fan-out region BB in the second direction Y can be reduced. For example, the width of the first fan-out region BB1 in the second direction Y may be significantly reduced. As a result, the width of the side frame (for example, the lower frame) of the display panel 210 can be reduced, the display panel 210 can realize an ultra-narrow lower frame, and the visual effect of the display panel 210 is improved.

In addition, it can be known from the above that the rounded corners are located in the edge regions AA1 of the display region AA. Therefore, by adopting the above arrangement manner, first data lines 111 at the rounded corners can be electrically connected to first fan-out lines 131 through connection lines 120, which avoids that the first fan-out lines 131 occupy the space of the fan-out region BB near the rounded corners. As a result, the width of the frame at the rounded corners can be reduced, and the display region AA of the display panel 210 can realize ultra-large rounded corners. In this way, the visual effect of the display panel 210 can be improved; in addition, the installation convenience between an outer frame of the display panel 210 and the display panel 210 can be improved, and the stress on the frame during installation is reduced, the risk of frame wrinkles or even cracks caused by the installation stress is reduced, the processing convenience of the display apparatus 200 is improved, and the yield rate of the display apparatus 200 is improved.

In addition, since the first data lines 111 located in the edge regions AA1 can be electrically connected to first fan-out lines 131 through connection lines 120, it is also conducive to reducing lengths of the first fan-out lines 131 electrically connected to the first data lines 111 (for example, as shown in FIG. 7, the first fan-out line 131 includes a first fan-out sub-line 133, when first to third first fan-out sub-lines 133 arranged from left to right along the first direction X are connected to first data lines 111 through connection lines 130, a shortening amount of the third first fan-out sub-line 133 is greater than a shortening amount of the second first fan-out sub-line 133, and the shortening amount of the second first fan-out sub-line 133 is greater than a shortening amount of the first fan-out sub-line 133), and in turn reducing resistances of the first fan-out lines 131. That is, the resistances on the first data lines 111 may be reduced, and the brightness of sub-pixels electrically connected to the first data lines 111 is improved. Furthermore, the length of the second fan-out line 132 remains unchanged, that is, the resistance of the second fan-out line 132 is substantially unchanged, and the length of the first fan-out line 131 is reduced to be closer to the length of the second fan-out line 132. With continued reference to FIG. 7, the second fan-out line 132 includes a third fan-out sub-line 136. Considering the third first fan-out sub-line 133 as an example, the shortened length of the third first fan-out sub-line 133 is less than a length of an adjacent third fan-out sub-line 136 on its left (an orientation shown in the figure). Therefore, the resistance of the third first fan-out sub-line 133 is less than the resistance of the adjacent third fan-out sub-line 136 on its left. On this basis, the third first fan-out sub-line 133 is further connected to the connection line 120, and the connection line 120 is located in the source-drain metal layer SD with a low resistance (may include a stacked structure of titanium/aluminum/titanium). Therefore, a total resistance of the third first fan-out sub-line 133 and the connection line 120 may be slightly less than or equal to the resistance of the adjacent third fan-out sub-line 136 on the left of the third first fan-out sub-line 133. That is to say, the resistance of the first data line 111 to which the third first fan-out sub-line 133 is electrically connected is slightly less than or equal to the resistance of the second data line 112 to which the adjacent third fan-out sub-line 136 on the left of the third first fan-out sub-line 133 (an orientation shown in the figure) is electrically connected. Thus, it is further conducive to reducing the resistance difference between the first data lines 111 and the second data lines 112 and improving the brightness uniformity of the display image.

It is worth noting that the connection line 120 is added between the first fan-out line 131 and the first data line 111. However, since the connection line 120 is located in at least one source-drain metal layer SD, and the source-drain metal layer SD includes a composite stacked structure of titanium/aluminum/titanium, which has a much smaller resistance compared with the gate metal layer Gate (including a molybdenum material). For example, the resistance of the source-drain metal layer SD may be one-tenth of the resistance of the gate metal layer Gate. Although adding the connection lines 120 may cause a slight increase in the resistances on the first data lines 111, the increased resistances are much smaller than the reduced resistances by shortening the first fan-out lines 131. Therefore, in some embodiments mentioned above, it is still conducive to reducing the resistances of the first data lines 111, balancing the resistance difference between the first data lines 111 and the second data lines 112, and in turn improving the uniformity of brightness of the display image.

For example, the above fan-out manner of adding the connection lines 120 may be referred to as a Fanout In AA (FIAA) or Fanout In Panel (FIP).

It can be seen from the above, in some examples, as shown in FIG. 7, the number of the connection lines 120 may be set to be the same as the number of the first data lines 110, and at this time, the first data lines 111 are connected to the connection lines 120 in one-to-one correspondence. For example, this arrangement manner may be referred to as whole FIAA.

In other examples, a part of the first data lines 111 may be connected to the connection lines 120 in one-to-one correspondence, and another part of the first data lines 111 may not connected to no connection line 120. For example, the another part of the first data lines 111 may be directly led out through the second fan-out lines 132, as is the case with the second data lines 112. In this way, it is conducive to reducing intervals between the plurality of data lines 110, increasing the pixel density of the display region AA, and enabling the display panel 210 to achieve high pixels per inch (PPI). For example, this arrangement manner may be referred to as part FIAA.

In summary, the display panel 210 can realize the narrow frame on the basis of high resolution by using the whole FIAA or part FIAA. In some examples, the display panel may be a quad high definition (QHD) display panel.

With continued reference to FIG. 7, in some embodiments, any two adjacent connection lines 120 may be defined as a first connection line 120*a* and a second connection line 120*b*. It can be understood that in this embodiment, the first connection line 120*a* and the second connection line 120*b* are only used to distinguish two adjacent connection lines 120, and do not further limit the connection lines 120.

In some examples, as shown in FIG. 7, the first data line 111 electrically connected to the first end of the first connection line 120*a* is farther away from the first central axis Q of the display substrate 100 relative to the first data line 111 electrically connected to the first end of the second connection line 120*b*. Moreover, the second end of the first connection line 120*a* is closer to the first central axis Q of the display substrate relative to the second end of the second connection line 120*b*. For example, the above connection manner may be referred to as reverse sequence FIAA.

In some other examples, the first data line 111 electrically connected to the first end of the first connection line 120*a* is closer to the first central axis Q of the display substrate 100 relative to the first data line 111 electrically connected to the first end of the second connection line 120*b*. Moreover, the second end of the first connection line 120*a* is closer to the first central axis Q of the display substrate 100 relative to the second end of the second connection line 120*b*. For example, the above connection manner may be referred to as positive sequence FIAA.

It can be understood that when the first data line 111 is electrically connected to the first fan-out line 131 through the connection line 120 (for example, using the above-mentioned reverse sequence FIAA or positive sequence FIAA), the arrangement order of ends of the plurality of fan-out lines 130 (including the first fan-out lines 131 and the second fan-out lines 132) away from the display region AA (e.g., ends that are electrically connected to the driver IC) along the first direction X is different from the arrangement order of the plurality of data lines 110 (including the first data lines 111 and the second data lines 112) along the first direction X.

For example, an edge of the display substrate 100 in the first direction X may be defined as a first edge. It can be understood that the first edge is any one of two edges of the display substrate 100 in the first direction X.

For example, multiple data lines 110 (including first data lines 111 and second data lines 112) arranged at intervals along a direction from the first edge of the display substrate 100 to the first central axis Q of the display substrate 100 may be defined as data line 1 to data line n. Data line 1 to data line m (m being less than n ($m<n$)) are located in the edge region AA1, and data line m+1 to data line n are located in the central region AA2. That is, data line 1 to data line m are first data lines 111, and data line m+1 to data line n are second data lines 112.

It can be seen from the above that the first end of the connection line 120 is electrically connected to the first data line 111, and the second end of at least one connection line 120 is located between two adjacent second data lines 112. For example, the second end of the connection line 120 electrically connected to data line 1 can be located between data line m+1 and data line m+2 (positive sequence FIAA); or the second end of the connection line 120 electrically connected to data line 1 can be located between data line n−1 and data line n (reverse sequence FIAA). That is, the second end of the connection line 120 is interposed between two adjacent second data lines 112 (for example, data line m+1 and data line m+2).

In this way, when the first fan-out line 131 is electrically connected to the second end of the connection line 120 and the second fan-out line 132 is electrically connected to the end of the second data line 112 proximate to the fan-out region BB, at least one first fan-out line 131 will be interposed between two adjacent second fan-out lines 132.

For example, multiple fan-out lines 130 (including first fan-out lines 131 and second fan-out lines 132), to which data line 1 to data line n are electrically connected in one-to-one correspondence, may be defined as fan-out line 1 to fan-out line n. Fan-out line 1 is electrically connected to data line 1, fan-out line 2 is electrically connected to data line 2, and so on.

Since at least one first fan-out line 131 is interposed between two adjacent second fan-out lines 132, ends of fan-out line 1 to fan-out line n away from the display region AA (that is, ends of the multiple fan-out lines 130 that are electrically connected to the driver IC) cannot be arranged in sequence along the direction from the first edge to the first central axis Q.

It can be seen from the above that, along the direction from the first edge to the first central axis Q, data line 1 to data line n are arranged at intervals. That is to say, if whole FIAA or part FIAA is used for wiring, it will result in the arrangement order of the ends, away from the display region AA, of the plurality of fan-out lines 130 (including the first fan-out lines 131 and the second fan-out lines 132) along the first direction X is different from the arrangement order of the plurality of data lines 110 (including the first data lines 111 and the second data lines 112) along the first direction X.

For example, the driver IC has output terminals, and the arrangement order of the output terminals of the driver IC along the first direction X is the same as the arrangement order of the plurality of data lines 110 along the first direction X. It can be understood that since the arrangement order of the ends, away from the display region AA, of the plurality of fan-out lines 130 (including the first fan-out lines 131 and the second fan-out lines 132) along the first direction X is different from the arrangement order of the plurality of data lines 110 (including the first data lines 111 and the second data lines 112) along the first direction X, the output terminals of the driver IC cannot output driving signals to the plurality of data lines 110 in sequence, that is, the driver IC cannot drive the plurality of columns of sub-pixels 101 to emit light in sequence. However, the cost of redeveloping the driver IC is high, which results in an increase in the cost of the display panel 210.

In some embodiments, as shown in FIG. 7, the display substrate 100 further has a bending region CC. The fan-out region BB includes a first fan-out region BB1 and a second fan-out region BB2, the first fan-out region BB1 is closer to the display region AA relative to the second fan-out region BB2, and the bending region CC is located between the first fan-out region BB1 and the second fan-out region BB2.

For example, the substrate 102 is a flexible substrate. At least one of the substrate 102 and the plurality of conductive layers 103 is disposed in the bending region CC. At least one of the substrate 102 and the plurality of conductive layers 103 can be bent in the bending region CC.

In some examples, the substrate 102 and the second source-drain metal layer SD2 are disposed in the bending region CC. The bending region CC is located between the first fan-out region BB1 and the second fan-out region BB2, so that a portion of the display substrate 100 located in the second fan-out region BB2 may be bent to a back of a portion of the display substrate 100 located in the display region AA, which avoids that the second fan-out region BB2 occupies a space on the display side of the display substrate 100. Therefore, the width of the side frame (e.g., the lower frame) of the display panel 210 can be further reduced, and the visual effect of the display panel 210 is improved.

In some embodiments, as shown in FIG. 7, the display substrate 100 further has a chip on panel (COP) region. The COP region is used for mounting the driver IC. The second fan-out region BB2 is located between the bending region CC and the COP region.

In some examples, as shown in FIG. 7, the display substrate 100 further has a cell test (CT) region. The CT region is used for testing the display substrate 100. In this case, the second fan-out region BB2 may be located between the CT region and the COP region. It should be noted that, at this time, a distance between the CT region and the bending region CC may be zero (that is, an intermediate fan-out region BB0 as shown in FIG. 7 may not exist), or may not be zero (that is, there may be an intermediate fan-out region BB0 shown in FIG. 7).

In addition, when there includes the intermediate fan-out region BB0, the intermediate fan-out region BB0 may be part of the second fan-out region BB2 (not shown in figure), or may not be part of the second fan-out region BB2 (as shown in FIG. 7).

In some examples, the display substrate 100 further has an inner lead bonding (ILB) region (not shown in figure) and a flexible printed circuit on panel (FOP) region (not shown in figure). The ILB region and the FOP region are sequentially located on a side of the COP region away from the second fan-out region BB2. In some examples, some pins of the driver IC may be electrically connected to pins in the FOP region through wires in the ILB region, and the pins in the FOP region may be used to connect to an external flexible printed circuit.

It can be seen from the foregoing description that in some embodiments of the present disclosure mentioned above, in a case where some data lines 110 are connected to the driver IC using FIAA, it may be whole FIAA (that is, all the first data lines 111 in the edge regions AA1 are lead out through the connection lines 120), or part FIAA (that is, part of the first data lines 111 in the edge regions AA1 are led out through the connection lines 120); or it may be positive sequence FIAA or reverse sequence FIAA. Some embodiments of the present disclosure will be introduced below by taking whole FIAA and reverse sequence FIAA shown in FIG. 7 as an example.

In some embodiments of the present disclosure, as shown in FIG. 7, the first fan-out line 131 includes a transfer line 134. The transfer line 134 is located in the second fan-out region BB2. The transfer line 134 and the plurality of second fan-out lines 132 are located in different conductive layers 103, and the transfer line 134 crosses at least one second fan-out line 132, so that the arrangement order of ends of the plurality of fan-out lines 130 away from the display region AA along the first direction X is the same as the arrangement order of the plurality of data lines 110 along the first direction X.

It can be understood that, in the embodiments of the present disclosure, a line "crosses" another line, that is, at least part of the line and the another line are located in different conductive layers 103, and an orthographic projection of the at least part of the line on the substrate 102 intersects an orthographic projection of the another line on the substrate 102, so that the line "crosses" the another line.

It can be understood that the transfer line 134 crosses at least one second fan-out line 132, that is, an orthographic projection of the transfer line 134 on the substrate 102 intersects an orthographic projection of the at least one second fan-out line 132 on the substrate 102. The transfer line 134 and the plurality of second fan-out lines 132 are located in different conductive layers 103, so that the transfer line 134 can be insulated from the plurality of second fan-out lines 132.

In some examples, a plurality of transfer lines 134 may be located in one conductive layer 103 or more conductive layers 103. For example, when the plurality of transfer lines 134 are located in multiple conductive layers 103, any one of the transfer lines 134 and the plurality of second fan-out lines 132 are located in different conductive layers 103.

In some examples, when the transfer lines 134 are located in multiple conductive layers 103, any two adjacent transfer lines 134 may be located in different conductive layers 103. In some examples, the transfer lines 134 may be located in the second source-drain metal layer SD2 and/or the third source-drain metal layer. For example, when the transfer lines 134 are located in the second source-drain metal layer SD2 and the third source-drain metal layer, any two adjacent transfer lines 134 are located in different source-drain metal layers SD (including the second source-drain metal layer SD2 and third source-drain metal layer).

It can be understood that, as shown in FIG. 7, the transfer line 134 crosses at least one second fan-out line 132, and the transfer line 134 is insulated from the plurality of second fan-out lines 132. In this way, by adjusting an extending direction or extending length of the transfer line 134, the arrangement order of the ends, away from the display region AA, of the plurality of first fan-out lines 131 along the first direction X may be adjusted.

That is, by setting the transfer line 134 across at least one second fan-out line 132, the arrangement order of the ends, away from the display region AA, of the first fan-out lines 131 (i.e., the ends of the first fan-out lines 131 that are electrically connected to the driver IC) may be adjusted. Therefore, the arrangement order of the ends, away from the display region AA, of the plurality of fan-out lines 130 (i.e., the ends of the plurality of fan-out lines 130 that are electrically connected to the driver IC) may be adjusted. In this way, the ends of fan-out line 1 to fan-out line n away from the display region AA may be sequentially arranged at intervals along a direction from the first edge to the first central axis Q, so that the arrangement order of the ends, away from the display region AA, of the plurality of fan-out lines 130 along the first direction X may be the same as the arrangement order of the plurality of data lines 110 along the first direction X.

Therefore, the arrangement order of the output terminals of the driver IC along the first direction X, the arrangement order of the ends, away from the display region AA, of the plurality of fan-out lines 130 along the first direction X, and the arrangement order of the plurality of data lines 110 along the first direction X may be the same. The output terminals of the driver IC may supply driving signals to the plurality of data lines 110 in sequence, that is, the driver IC may drive the plurality of columns of sub-pixels 101 to emit light in sequence. There is no need to re-development of the driver IC. On the basis of achieving the narrow frame of the display substrate 100, the cost of the display substrate 100 is reduced.

In addition, the transfer lines 134 are arranged in the second fan-out region BB2, which prevents the transfer lines 134 from occupying the space of the first fan-out region BB1 and reduces the width of the first fan-out region BB1. Since the first fan-out region BB1 is located on a side of the bending region CC proximate to the display region AA, the width of the first fan-out region BB1 is reduced, and the width of the lower frame of the display substrate 100 is further reduced. As a result, the visual effect of the display panel 210 is improved.

In some examples, the first fan-out lines 131 are directly electrically connected to the output terminals of the driver IC through the transfer lines 134. In some other examples, the first fan-out lines 131 further include other lines, and the first fan-out lines 131 are electrically connected to the output terminals of the driving IC through the other lines.

In some embodiments of the present disclosure, with continued reference to FIG. 7, the transfer line 134 includes a main body 1340 and two connection ends (G1, G2), and the main body 1340 is located on a side of the two connection ends (G1, G2) proximate to the display region AA. Hereinafter, for convenience of the description, among the two connection ends, a connection end proximate to the first central axis Q is defined as a first connection end G1, and a connection end away from the first central axis Q is defined as a second connection end G2.

For example, the first connection end G1 may be used to connect a portion of the first fan-out line 131 proximate to the display region AA, and the second connection end G2 may be used to connect a portion of the first fan-out line 131 proximate to the COP region.

In some examples, as shown in FIG. 7, the first fan-out line 131 further includes a first fan-out sub-line 133 and a second fan-out sub-line 135. The first connection end G1 is electrically connected to the first fan-out sub-line 133, and is electrically connected to the connection line 120 through the first fan-out sub-line 133. The second connection end G2 is electrically connected to the second fan-out sub-line 135, and is electrically connected to the driver IC through the second fan-out sub-line 135.

In some examples, as shown in FIG. 7, the second fan-out line 132 includes a third fan-out sub-line 136 and a fourth fan-out sub-line 137. An end of the third fan-out sub-line 136 is electrically connected to the second data line 112, another end of the third fan-out sub-line 136 is electrically connected to the fourth fan-out sub-line 137, and an end of the fourth fan-out sub-line 137 away from the third fan-out sub-line is electrically connected to the driver IC.

For example, along the first direction X, a plurality of third fan-out sub-lines 136 and a plurality of first fan-out sub-lines 133 are arranged alternately. For example, four third fan-out sub-lines 136 may be in a group, and two first fan-out sub-lines 133 may be in a group, and the group and the group are arranged alternately (that is, 4-insert-2 manner). Of course, the embodiments of the present disclosure are not limited thereto.

For example, 3-insert-1, 4-insert-3, etc. manners may also be used. On this basis, adjacent fan-out sub-lines (e.g., adjacent third fan-out sub-line 136 and first fan-out sub-line 133, or adjacent two third fan-out sub-lines 136, or adjacent two second fan-out sub-lines 133) may be located in different gate metal layers Gate. For example, one of the adjacent fan-out sub-lines is located in the first gate metal layer Gate1, and another of the adjacent fan-out sub-lines is located in the second gate metal layer Gate2. In this way, it is conducive to reducing signal crosstalk between adjacent fan-out sub-lines.

In some examples, by using the FIAA, portions of the third fan-out sub-line 136 and the first fan-out sub-line 133 located in the first fanout region BB1 have small included angles with the first central axis Q, which means that they tend to be parallel to the first central axis Q. Therefore, in the first fan-out region BB1, there may be more spacing between the third fan-out sub-line 136 and the first fan-out sub-line 133, between two third fan-out sub-lines 136, and between two first fan-out sub-lines 133. Thus, portions, located in the first fan-out region BB1, of the third fan-out sub-line 136 and the first fan-out sub-line 133 may be arranged in the same source-drain metal layer SD, or may be alternately located in different source-drain metal layers SD along the first direction X. In this way, the third fan-out sub-line 136 and the first fan-out sub-line 133 may have a small resistance, that is, the first data line 111 and the second data line 112 may have a small resistance, which is conducive to improving the display brightness of the display substrate 100.

In addition, in order to reduce resistance, a portion, located in the bending region CC, of any one of the third fan-out sub-line 136 and the first fan-out sub-line 133 may be arranged in a film layer other than the gate metal layer (e.g., any source-drain metal layer), which is not limited in the embodiments of the present disclosure.

It can be understood that, referring to FIG. 7, portions of the first fan-out sub-line 133 and the third fan-out sub-line 136 located in the second fanout region BB2 needs to be arranged obliquely, so as to achieve further convergence and facilitate the subsequent electrical connecting to the driver IC through the transfer line 134, the second fan-out sub-line 135 and the fourth fan-out sub-line 137. In the second direction Y, a width of the second fan-out region BB2 occupied by the oblique portions is greater than a width of the second fan-out region BB2 occupied by both the second fan-out sub-line 135 and the fourth fan-out sub-line 137.

On this basis, if the main body 1340 is located on a side of the two connection ends (G1, G2) proximate to the COP region, there is a need to further increase the width of the second fan-out region BB2 along the second direction Y. In this way, the length of the second fan-out sub-line 135 and the length of the fourth fan-out sub-line 137 may be increased, which may increase the resistance of the plurality of data lines 110, and in turn affect the display brightness of the display substrate 100 and the display effect of low grayscale images.

In some embodiments of the present disclosure as mentioned above, since the main body 1340 is located on the side of the two connection ends (G1, G2) proximate to the display region AA, the main body 1340 and a region where the first fan-out sub-line 133 and the third fan-out sub-line 136 are located may overlap in a thickness direction of the substrate 102. In this way, in the second direction Y, the width of the second fan-out region BB2 occupied by the oblique portions of the first fan-out sub-line 133 and the third fan-out sub-line 136 is large, so that there is no need to extend the first fan-out sub-line 133 and the third fan-out sub-line 136, and it is conducive to reducing the space occupied by the fan-out lines 130 on the second fan-out region BB2 along the second direction Y, and in turn reducing the width of the second fan-out region BB2 along the second direction Y. Moreover, it is also conducive to reducing the length of the second fan-out sub-line 135 and the length of the fourth fan-out sub-line 137. That is, compared with the above-mentioned case where the main body 1340 is located on the side of the two connection ends (G1, G2) proximate to the COP region, it is conducive to reducing the resistance of the plurality of data lines 110, and in turn improving the display brightness of the display substrate 100 and improving the display effect of low grayscale images.

In some embodiments, as shown in FIG. 7, the display substrate 100 further includes an isolation block 140. The isolation block 140 separates the transfer lines 134 from the first fan-out sub-lines 133, and separates the transfer lines 134 from the third fan-out sub-lines 136.

For example, the first fan-out sub-lines 133 and the third fan-out sub-lines 136 are located in at least one gate metal layer Gate. The transfer lines 134 are located in the second source-drain metal layer SD2 and/or the third source-drain metal layer. The isolation block may be located in the first source-drain metal layer SD1.

In this embodiment, in this way, it is conducive to reducing the signal crosstalk between the transfer lines 134 and the first fan-out sub-lines 133, and reducing the signal crosstalk between the transfer lines 134 and the third fan-out sub-lines 136, and in turn improving the brightness uniformity of the display region AA. Therefore, a problem such as flicker or defective dark lines of the plurality of sub-pixels in the display substrate 100 is not easy to occur.

In some examples, as shown in FIG. 7, the isolation block 140 is connected to a voltage signal line 141. That is, the isolation block 140 may be configured to transmit a voltage signal. For example, the voltage signal line 141 may be, but not limited to, any one of signal lines such as a Vdd signal line for providing a voltage for the anodes of the light-emitting devices 300 and a Vss signal line for providing a voltage for the cathodes of the light-emitting devices 300.

It can be understood that, through the isolation block 140 configured to transmit the voltage signal, the transfer lines 134 and the first fan-out sub-lines 133 are isolated, and the transfer lines 134 and the third fan-out sub-lines 136 are isolated, so that there is no need to additionally provide other components, the manufacturing process is simplified, and the cost of the display substrate 100 is reduced.

Figure 8:
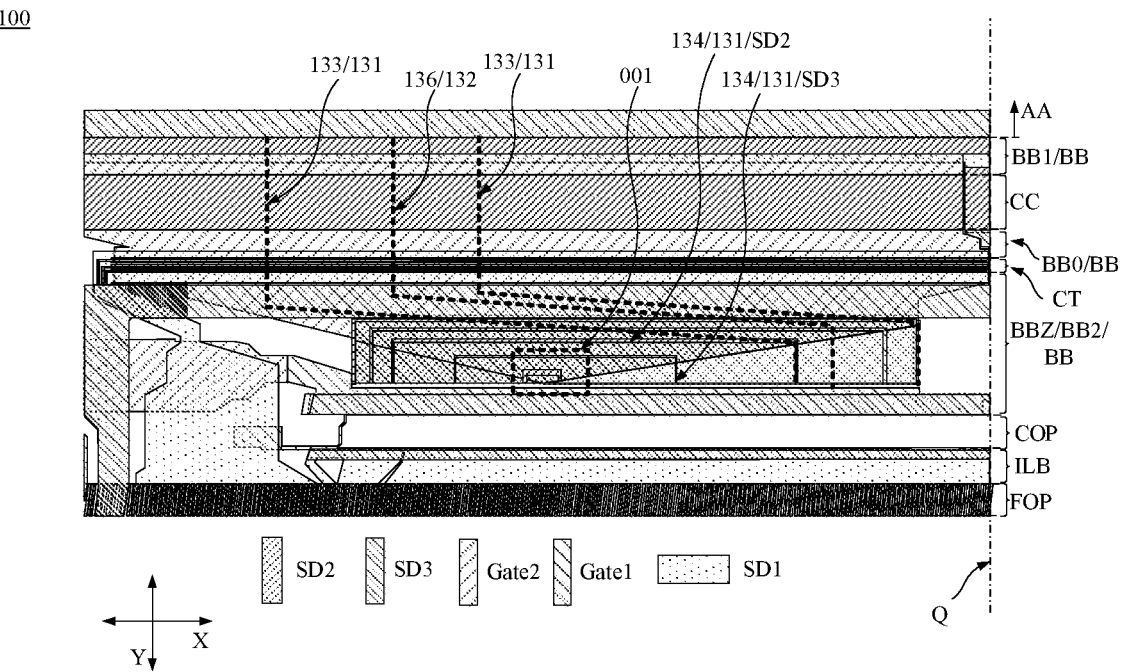
FIG. 8 is a diagram showing a partial structure of a display substrate, in accordance with some embodiments.
Figure 9:
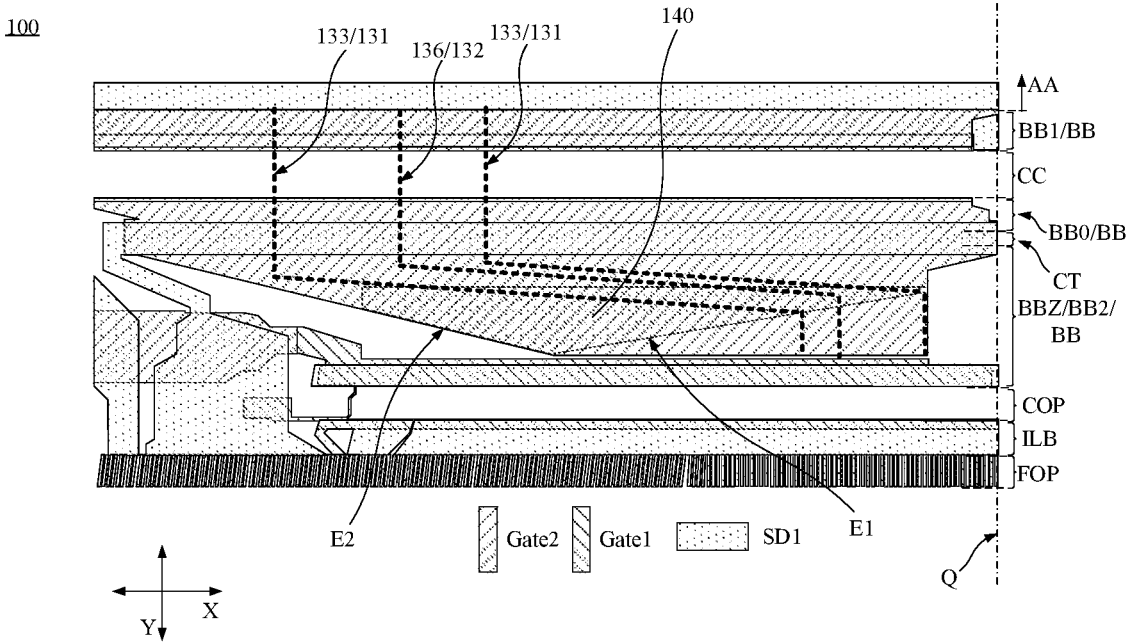
FIG. 9 is a structural diagram of the first gate metal layer, the second gate metal layer and the first source-drain metal layer in FIG. 8.
Figure 10:
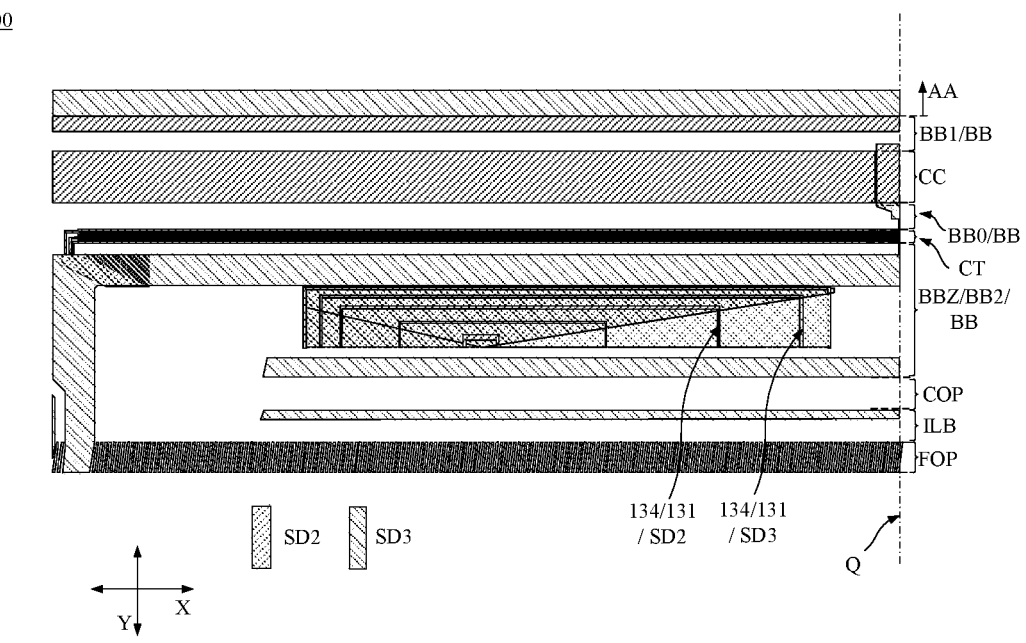
FIG. 10 is a structural diagram of the second source-drain metal layer and the third source-drain metal layer in FIG. 8.

FIG. 8 is a diagram showing a partial structure of a display substrate, in accordance with some embodiments. FIG. 9 is a diagram showing structures of the first gate metal layer, the second gate metal layer and the first source-drain metal layer in FIG. 8. FIG. 10 is a diagram showing structures of the second source-drain metal layer and the third source-drain metal layer in FIG. 8.

For example, as shown in FIGS. 8 to 10, a region of the second fan-out region BB2 located on a side of the first central axis Q is a fan-out sub-region BBZ. The wiring manner in one fan-out sub-region BBZ is mainly introduced below. It can be understood that the wiring manners in two fan-out sub-regions BBZ may be the same or different.

In some embodiments of the present disclosure, as shown in FIGS. 8 to 10, the display substrate 100 includes the first gate metal layer Gate1, the second gate metal layer Gate2, the first source-drain metal layer SD1, the second source-drain metal layer SD2 and the third source-drain metal layer SD3 that are sequentially away from the substrate 102. Moreover, the display substrate 100 has the first fan-out region BB1, the bending region CC, the intermediate fan-out region BB0 (optional), the CT region, the second fan-out region BB2, the COP region, the ILB region and the FOP region that are sequentially away from the display region AA. A portion of the display substrate 100 located on a side of the bending region CC away from the display region AA may be bent to the back of the portion of the display substrate 100 located in the display region AA, which avoids that the portion of the display substrate 100 located on the side of the bending region CC away from the display region AA occupies the space on the display side of the display substrate 100, so that the width of the side frame (e.g., the lower frame) of the display panel 210 can be reduced, and the visual effect of the display panel 210 is improved.

In some embodiments, as shown in FIGS. 8 and 10, the transfer line 134 is U-shaped or approximately U-shaped. An opening of the transition line 134 faces the COP region.

It can be understood that the transfer line 134 that is U-shaped or approximately U-shaped can cross at least one second fan-out line 132, so that the transfer line 134 can adjust the arrangement order of the ends, away from the display region AA, of the plurality of first fan-out lines 131 along the first direction X. Therefore, the ends of fan-out line 1 to fan-out line n away from the display region AA can be sequentially arranged at intervals along the direction from the edge to the first central axis Q, that is, the arrangement order of the ends, away from the display region AA, of the plurality of fan-out lines 130 along the first direction X may be the same as the arrangement order of the plurality of first data lines 110 along the first direction X.

For example, as shown in FIG. 9, the isolation block 140 is located on a side of the second gate metal layer Gate2 away from the first gate metal layer Gate1. For example, the isolation block 140 may be located in the first source-drain metal layer SD1.

On this basis, for example, any one of the first fan-out sub-line 133 and the third fan-out sub-line 136 is located in the first gate metal layer Gate1 and/or the second gate metal layer Gate2, and the transfer line 134 is located in the second source-drain metal layer SD2 and/or the third source-drain metal layer. Therefore, the isolation block 140 may be used to separate the transition line 134 from the first fan-out sub-line 133 and separate the transfer line 134 from the third fan-out sub-line 136. Therefore, it is conducive to reducing the signal crosstalk between the transfer line 134 and the first fan-out sub-line 133, and reducing the signal crosstalk between the transfer line 134 and the third fan-out sub-line 136, and in turn improving the brightness uniformity of the display substrate 100. Therefore, the problem such as flicker or defective dark lines of the display substrate 100 is not easy to occur.

Figure 11:
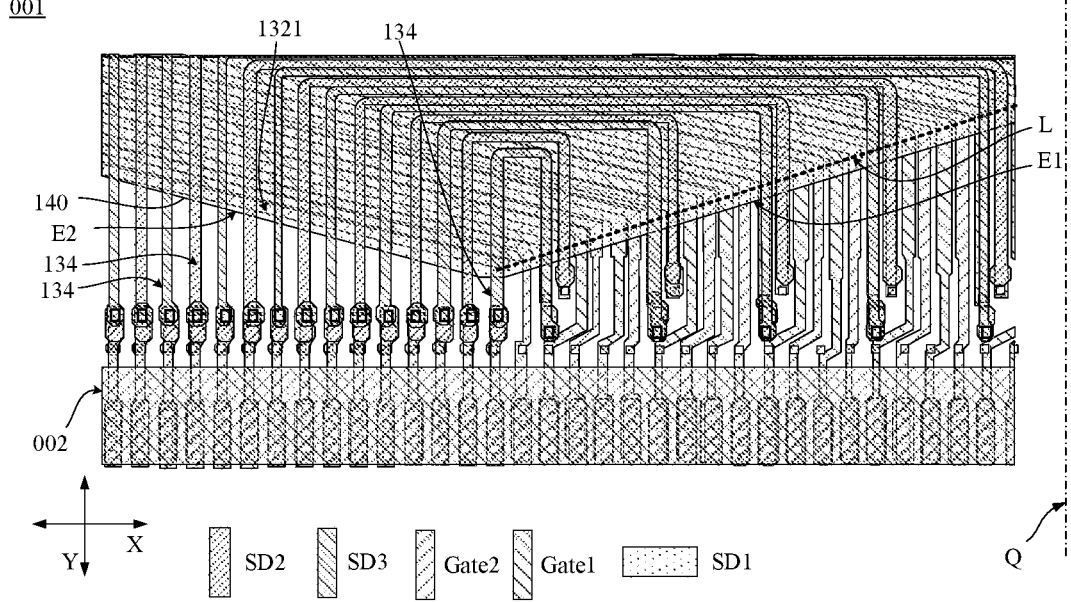
FIG. 11 is a diagram showing a partial structure of the region 001 FIG. 8.

FIG. 11 is a diagram showing a partial structure of the region 001 in FIG. 8. FIGS. 12 to 17 are structural diagrams of film layers in FIG. 11.

In some embodiments, as shown in FIG. 11, in the fan-out sub-region, the plurality of transfer lines 134 are arranged radially. The "radial arrangement" means that for any two adjacent transfer lines 134, an outer transfer line 134 is partially around an inner transfer line 134, which is, for example, the arrangement shown in FIG. 11.

For example, each transfer line 134 is U-shaped, and the inner transfer line 134 is substantially located inside the outer transfer line 134.

In this embodiment, in two adjacent transfer lines 134, the outer transfer line 134 is arranged around the inner transfer line 134, which is conducive to saving the wiring space, increasing a distance between the transfer line 134 and the transfer line 134, reducing the signal crosstalk, and reducing a size of the second fan-out region BB2 of the display substrate 100 along the second direction Y. Therefore, the lower frame of the display substrate 100 may be set narrower.

For example, adjacent transfer lines 134 may be substantially parallel to each other. In this way, the distance between the adjacent transfer lines 134 may be substantially kept consistent, which is conducive to reducing signal interference between the adjacent transfer lines 134 and in turn improving the brightness uniformity of the display image of the display substrate.

In some embodiments, as shown in FIG. 11, two adjacent transfer lines are located in different conductive layers. In this way, it is conducive to further improving the signal interference between adjacent transfer lines 134, and in turn improving the brightness uniformity of the display image of the display substrate.

Figure 12:
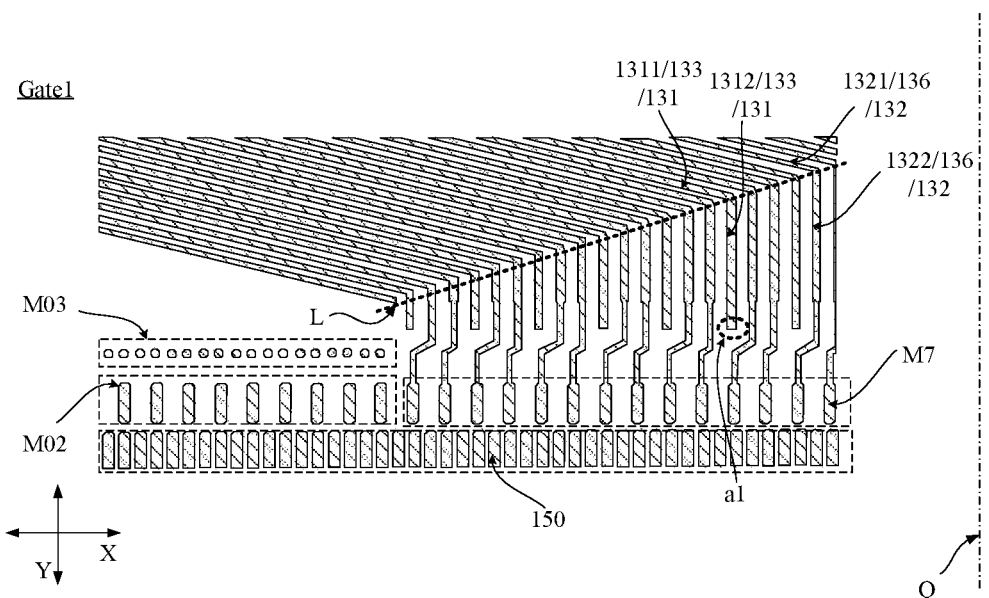
FIGS. 12 to 17 are structural diagrams of film layers in FIG. 11.
Figure 13:
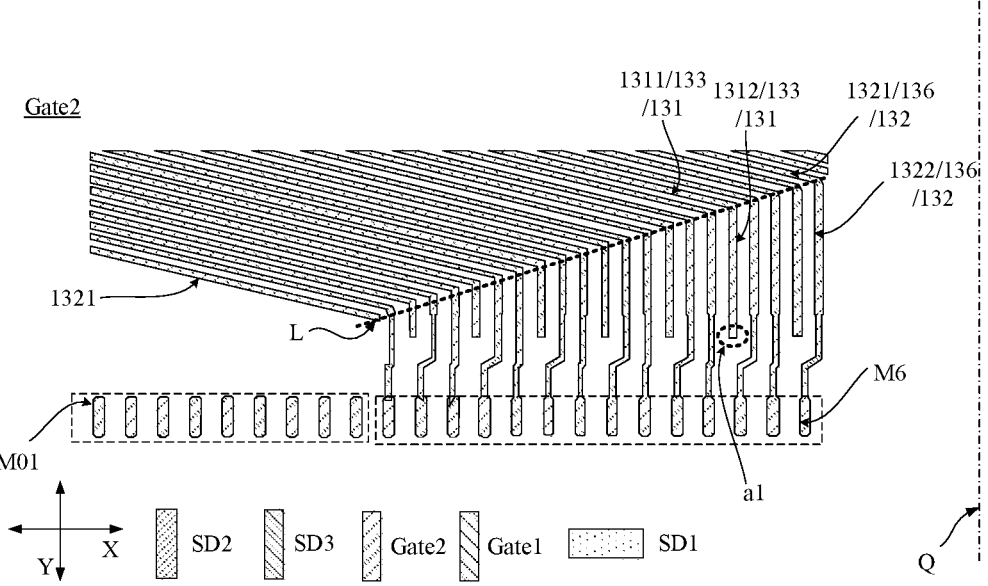

Referring to FIGS. 12 and 13, in some embodiments, the first fan-out line 131 further includes a first line segment 1311 and a second line segment 1312 that are sequentially away from the display region AA and electrically connected to each other. That is, the first fan-out sub-line 133 in the first fan-out line 131 may include the first line segment 1311 and the second line segment 1312 that are sequentially away from the display region AA and electrically connected to each other. The first line segment 1311 is gradually close to the first central axis Q from an end proximate to the display region AA to an end away from the display region AA. The second line segment 1312 is parallel to the first central axis Q.

The second fan-out line 132 includes a third line segment 1321 and a fourth line segment 1322 that are sequentially away from the display region AA and electrically connected to each other. That is, the third fan-out sub-line 136 in the second fan-out line 132 may include the third line segment 1321 and the fourth line segment 1322 that are sequentially away from the display region AA and electrically connected to each other. The third line segment 1321 is gradually close to the first central axis Q from an end proximate to the display region AA to an end away from the display region AA. The fourth line segment 1322 is parallel to the first central axis Q.

Figure 16:
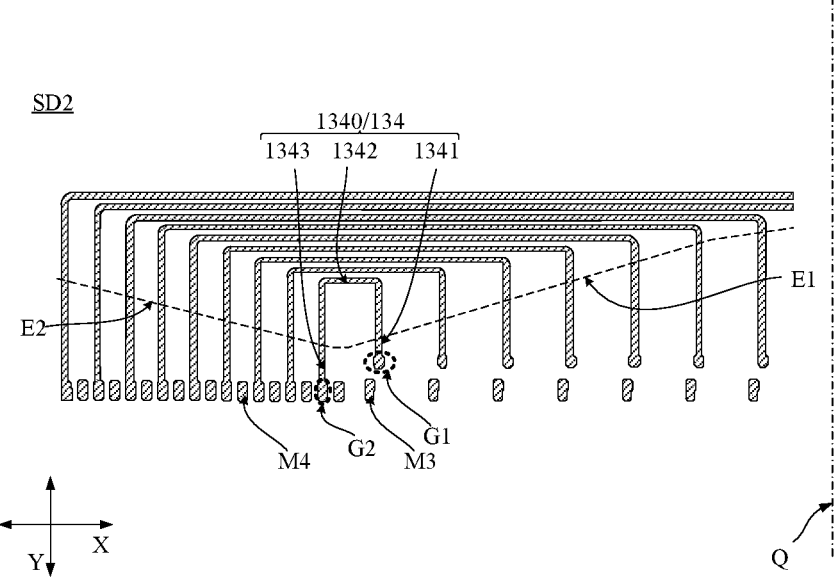
Figure 17:
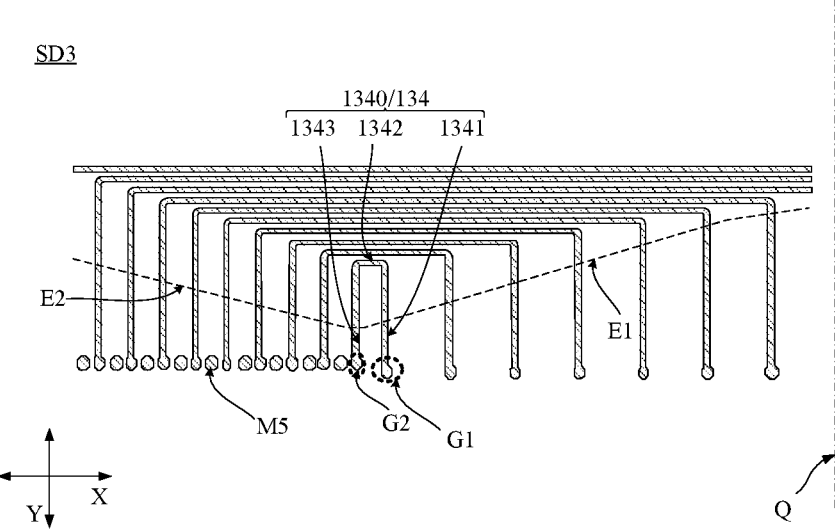

As shown in FIGS. 16 and 17, the transfer line 134 includes a connection end proximate to the first central axis Q (i.e., a first connection end G1) and a connection end away from the first central axis Q (i.e., a second connection end G2). The connection end of the transfer line 134 proximate to the first central axis Q (i.e., the first connection end G1) may be electrically connected to an end a1 of the second line segment 1312 away from the first line segment 1311 shown in FIGS. 12 and 13.

Figure 14:
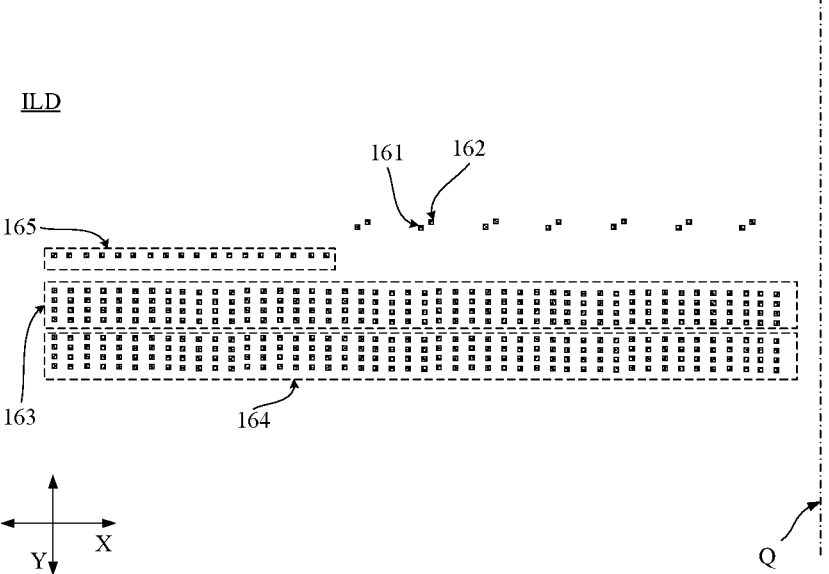

An interlayer dielectric layer ILD shown in FIG. 14 includes first connection holes 161 and second connection holes 162. The first source-drain metal layer SD1 shown in FIG. 15 includes first transfer portions M1 and second transfer portions M2.

Two adjacent second line segments 1312 are respectively located in the first gate metal layer Gate1 and the second gate metal layer Gate2. Among ends a1 of the two adjacent second line segments 1312, an end a1 of a second line segment 1312 located in the first gate metal layer Gate1 may be electrically connected to a first transfer portion M1 in the first source-drain metal layer SD1 through a first connection hole 161, and an end a1 in the second gate metal layer Gate2 may be directly electrically connected to a second transfer portion M2 in the first source-drain metal layer SD1 through a second connection hole 162.

It can be seen from the above description that, a transfer hole electrically connecting a conductive line in the first source-drain metal layer SD1 and a conductive line in the second source-drain metal layer SD2 may be referred to as a PLN1 hole, and a transfer hole electrically connecting a conductive line in the second source-drain metal layer SD2 and a conductive line in the third source-drain metal layer may be referred to as a PLN2 hole. Therefore, the first connection end G1 of the transfer line 134 in the second source-drain metal layer SD2 shown in FIG. 16 may be electrically connected to the second transfer portion M2 through the PLN1 hole. Since the second transfer portion M2 is electrically connected to an end a1 of a second line segment 1312, the first connection end G1 of the transfer line 134 in the second source-drain metal layer SD2 shown in FIG. 16 may be electrically connected to the end a1 of the second line segment 1312.

On this basis, the second source-drain metal layer SD2 shown in FIG. 16 may further include third transfer portions M3. The first connection end G1 of the transfer line 134 in the third source-drain metal layer SD3 shown in FIG. 17 may be electrically connected to the third transfer portion M3 through the PLN2 hole, and the third transfer portion M3 may be electrically connected to the first transfer portion M1 through the PLN1 hole. Since the first transfer portion M1 is electrically connected to an end a1 of another second line segment 1312, the first connection end G1 of the transfer line 134 in the third source-drain metal layer SD3 shown in FIG. 17 may be electrically connected to the end a1 of the another second line segment 1312.

In some embodiments, as shown in FIG. 16, the second source-drain metal layer SD2 further includes fourth transfer portions M4. As shown in FIG. 17, the third source-drain metal layer SD3 further includes fifth transfer portions M5.

The second connection end G2 of the transfer line 134 in the second source-drain metal layer SD2 may be electrically connected to the fifth transition portion M5 in the third source-drain metal layer SD3 through the PLN2 hole, and the second connection end G2 of the transfer line 134 in the third source-drain metal layer SD3 may be electrically connected to the fourth transfer portion M4 in the second source-drain metal layer SD2 through the PLN2 hole. In this way, it is conducive to balancing difference in parasitic capacitance between adjacent transfer lines 134 in different layers.

Figure 15:
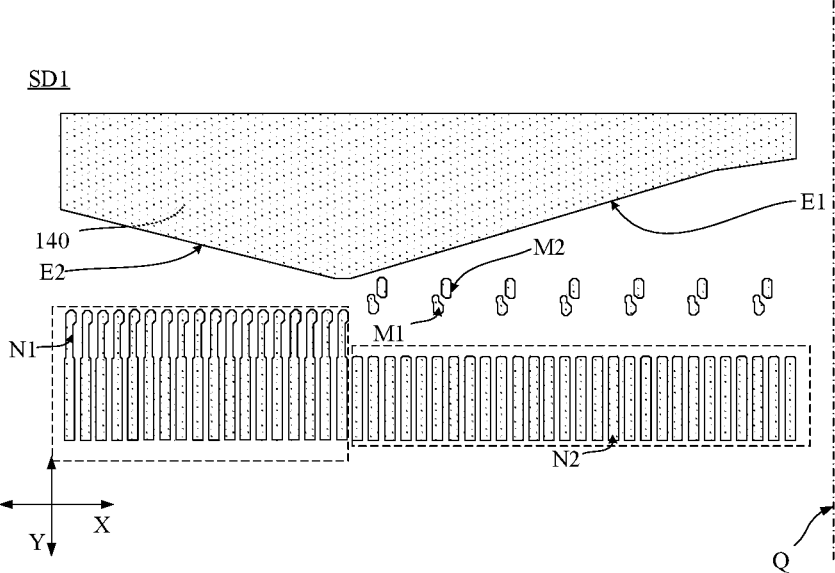

On this basis, as shown in FIG. 15, the first source-drain metal layer SD1 includes first extension lines N1 and second extension lines N2.

The second connection ends G2 of the transfer lines 134 and the fourth transfer portions M4 in the second source-drain metal layer SD2 may be electrically connected to different first extension lines N1 through different PLN1 holes, respectively.

As shown in FIG. 12, the first gate metal layer Gate1 includes seventh transfer portions M7 and second dummy transfer portions M02. As shown in FIG. 13, the second gate metal layer Gate2 includes sixth transfer portions M6 and first dummy transfer portions M01. As shown in FIG. 14, the interlayer dielectric layer ILD further includes third connection holes 163. A plurality of first extension lines N1 are connected to the first dummy transfer portions M01 and the second dummy transfer portions M02 through a part of the third connection holes 163, and a plurality of second extension lines N2 are connected to the sixth transfer portions M6 and the seventh transfer portions M7 through another part of the third connection holes 163.

In this way, both the first fan-out lines 131 and the second fan-out lines 132 may be transferred to the first source-drain metal layer SD1. Moreover, by providing the first dummy transfer portions M01 and the second dummy transfer portions M02, the difference in parasitic capacitance between the plurality of fan-out lines 130 caused by the cross-layer transfer may be balanced.

As shown in FIG. 14, the interlayer dielectric layer ILD further includes fourth connection holes 164. The first extension lines N1 and the second extension lines N2 may be connected to pins 150 in the first gate metal layer Gate1 through the fourth connection holes 164. The pins 150 in the first gate metal layer Gate1 may be used to connect to the driver IC. By arranging all the pins for connecting the driver IC in the first gate metal layer Gate1, it is conducive to improving the stability of the driver IC after soldering.

In addition, as shown in FIG. 12, the first gate metal layer Gate1 further includes third dummy transfer portions M03. As shown in FIG. 14, the interlayer dielectric layer ILD further includes fifth connection holes 165.

The first extension lines N1 may be connected to the third dummy transfer portions M03 in the first gate metal layer Gate1 through the fifth connection holes 165. In this way, it is conducive to balancing the difference in parasitic capacitance between the plurality of fan-out lines 130 caused by the cross-layer transfer.

In some examples, referring to FIG. 11, in the region 002 (that is, a rectangular region in FIG. 11 which is filled with a grid-like pattern), no insulating layer between the first source-drain metal layer SD1 and the second source-drain metal layer SD2 may be provided. That is, the first extension line N1 and the second extension line N2 arranged in the region 002 may be a stacked structure located in both the first source-drain metal layer SD1 and the second source-drain metal layer SD2. In this way, it is conducive to reducing the resistances of the first extension line N1 and the second extension line N2, and in turn improving the display effect of the display substrate 100.

In some embodiments, as shown in FIGS. 11, 12 and 13, in the fan-out sub-region BBZ, a plurality of first line segments 1311 and a plurality of third line segments 1321 are alternately arranged.

For example, as shown in FIGS. 12 and 13, four adjacent third fan-out sub-lines 136 may be classified into a first line group, and two adjacent first sub-lines may be classified into a second line group, and the first line group and the second line group are alternately arranged, which means that "4-insert-2" manner is adopted for wiring. It should be noted that in some other examples, "3-insert-1", "4-insert-3" and other manners may also be adopted for wiring, which may be flexibly set according to wiring space and other factors.

Referring to FIGS. 12 and 13, a fitting straight line L defined by an end of the first line segment 1311 away from the display region AA and an end of the third line segment 1321 away from the display region AA is gradually close to the display region AA from an end thereof away from the first central axis Q to an end thereof proximate to the first central axis Q.

In this way, it may be possible to increase the arrangement range of the ends a1, away from the display region AA, of the second line segments 1312 along the second direction Y Therefore, by adjusting the positions of the ends a1 of different second line segments 1312, the resistance difference between the plurality of first fan-out lines 131 may be balanced, which is conducive to balancing the resistance difference between the plurality of first fan-out lines 131 and the plurality of second fan-out lines 132. Therefore, the resistance difference between the plurality of first data lines 111 and the plurality of second data lines 112 is reduced, and the brightness uniformity of the display substrate 100 is improved.

In some examples, as shown in FIG. 11, in the fan-out sub-region BBZ, among the plurality of second line segments 1312, at least two (e.g., two) second line segments 1312 that are directly adjacent are in the same group, and ends a1, away from the display region AA, of the second line segments 1312 in the same group are arranged staggered along the first direction X.

In this example, since the ends, away from the display region AA, of the second line segments 1312 in the same group are arranged staggered along the first direction X, it is conducive to saving the wiring space, reducing the signal crosstalk between adjacent second line segments, and improving the brightness uniformity of the display substrate 100.

In some examples, in the fan-out sub-region BBZ, in two adjacent second line segments 1312, a length of a second line segment 1312 close to the first central axis Q is less than a length of a second line segment 1312 away from the first central axis Q; and in two adjacent transfer lines 134, a connection end of a transfer line 134 close to the first central axis Q for connecting a second line segment 1312 (that is, a first connection end G1) is closer to the display region AA relative to a connection end of a transfer line 134 away from the first central axis Q for connecting to a second line segment 1312 (i.e., a second connection end G2).

It should be noted that, for the reverse sequence FIAA shown in FIG. 7, the closer the first fan-out sub-line 133 is to the first central axis Q, the closer the first data line connected thereto is to an edge of the display region along the first direction X. Thus, the connection line 120 connected to the first fan-out sub-line 133 closer to the first central axis Q is longer, and the total resistance of the first fan-out sub-line 133 closer to the first central axis Q and the connected connection line 120 is greater. Therefore, in some examples of the present disclosure as mentioned above, in the fan-out sub-region BBZ, among the two adjacent second line segments 1312, the length of the second line segment 1312 close to the first central axis Q is less than the length of the second line segment 1312 away from the first central axis Q; and in two adjacent transfer lines 134, a connection end of a transfer line 134 close to the first central axis Q for connecting a second line segment 1312 (that is, a first connection end G1) is closer to the display region AA relative to a connection end of a transfer line 134 away from the first central axis Q for connecting to a second line segment 1312 (i.e., the second connection end G2). Among the two adjacent first fan-out sub-lines 133, the length reduction of the first fan-out sub-line 133 close to the first central axis Q is greater than the length reduction of the first fan-out sub-line 133 away from the first central axis Q, so that the resistance reduction of the first fan-out sub-line 133 close to the first central axis Q is also greater than the resistance reduction of the first fan-out sub-line 133 away from the first central axis Q. As a result, the resistance difference between the plurality of first fan-out sub-lines 133 may be well balanced, that is, the resistance difference between the plurality of first data lines 111 may be balanced, and the brightness uniformity of the display substrate 100 is improved.

In some examples, as shown in FIGS. 16 and 17, the main body 1340 includes a first transfer segment 1341.

The first transfer segment 1341 is connected to a connection end of the transfer line 134 that is connected to the second line segment 1312 (i.e., the first connection end G1). An orthographic projection of the first transfer segment 1341 on the substrate overlaps or approximately overlaps with an orthographic projection of the corresponding connected second line segment 1312 on the substrate.

It should be noted that since the first transfer segment 1341 and the second line segment 1312 are used to transmit the same signal, there is no signal crosstalk between the two. In addition, by overlapping the two along the thickness direction of the substrate, it is conducive to saving the wiring space.

In some examples, as shown in FIGS. 16 and 17, the main body 1340 further includes a second transfer segment 1342 connected to the first transfer segment 1341 and a third transfer segment 1343 connected to the second transfer segment 1342.

For example, referring to FIGS. 11 and 12 to 17, the isolation block 140 is located on a side, away from the substrate, of the first line segments 1311 and the third line segments 1321, and the isolation block 140 covers the first line segments 1311 and the third line segments 1321. The transfer lines 134 are located on a side of the isolation block 140 away from the substrate. An orthographic projection of the second transfer segment 1342 on the substrate is located within an orthographic projection of the isolation block 140 on the substrate. Orthographic projections of the first transfer segment 1341 and the third transfer segment 1343 on the substrate are located outside the orthographic projection of the isolation block 140 on the substrate.

In this way, it may not only facilitates the adjustment of the transfer position of the end a1 of the second line segment 1312 away from the display region AA and the transfer line 134, so as to balance the resistance difference between the plurality of data lines 110, but also facilitates the use of the isolation block 140 to separate the second transfer segment 1342 of the transfer line 134 and the first line segment 1311 of the first fan-out sub-line 133 and to separate the second transfer segment 1342 of the transfer line 134 and the third line segment 1321 of the third fan-out sub-line 136. Thus, it may be possible to avoid crosstalk between the second transfer segment 1342 of the transfer line 134 and the first line segment 1311 of the first fan-out sub-line 133, avoid crosstalk between the second transfer segment 1342 of the transfer line 134 and the third line segment 1321 of the third fan-out sub-line 136, and improve the brightness uniformity of the display substrate 100.

In FIGS. 16 and 17, the dotted line approximately extending along the first direction X is a partial border of the isolation block 140. For example, the transfer line 134 may be divided into a first transfer segment 1341, a second transfer segment 1342 and a third transfer segment 1343 according to a position of the partial border.

For example, as shown in FIGS. 16 and 17, the first transfer segment 1341 and the third transfer segment 1343 are both parallel to the first central axis Q, and the second transfer segment 1342 is U-shaped or approximately U-shaped. It can be understood that, in other examples, since the position of the border of the isolation block 140 varies, positions of boundaries between the first transfer segment 1341, the second transfer segment 1342 and the third transfer segment 1343 are also not fixed.

For example, at least one of the second line segment 1312 and the fourth line segment 1322 may be configured to include a serpentine line or other irregular line. In this way, it is conducive to further balancing the resistance between the plurality of fan-out lines, and in turn balancing the resistance between the plurality of data lines.

In some embodiments, referring to FIGS. 11, 15, 16 and 17, the isolation block 140 includes a first border E1 and a second border E2. The first border E1 is gradually far away from the display region AA along a direction moving close to the first central axis Q; the second border E2 is gradually close to the display region AA along the direction moving towards the first central axis Q.

It should be noted that any one of the first border E1 and the second border E2 may be at least one straight line (for example, in the example shown in FIG. 15, the first border E1 is one straight line, and the second border E2 is two straight lines that are connected), or may be at least one curved line, or may be at least one straight line and at least one curved line that are connected. In addition, FIGS. 11, 15, 16, and 17 only show parts of the first border E1 and the second border E2. As for more complete first border E1 and second border E2, reference may be made to the isolation block 140 shown in FIG. 9. For example, the first border E1 and the second border E2 may be directly connected or indirectly connected to each other.

In some examples, as shown in FIGS. 11 to 13, the first border E1 coincides or approximately coincides with the fitting straight line L defined by the end of the first line segment 1311 away from the display region AA and the end of the third line segment 1321 away from the display region AA. Here, "approximately coincide" means that there may be a small distance, e.g., a distance of several microns, between the first border E1 and the fitting straight line L.

In this example, the area of the isolation block 140 may be set to be small, thus reducing the space occupation of the second fan-out region BB, realizing the signal shielding for the first line segment 1311 and the transfer line 134, and realizing the signal shielding for the third line segment 1321 and the transfer line 134. Therefore, it may be possible to avoid the signal crosstalk between the first line segment 1311 and the transfer line 134, avoid the signal crosstalk between the third line segment 1321 and the transfer line 134, and improve the brightness uniformity of the display substrate 100.

In some examples, as shown in FIGS. 11 and 13, the second border E2 coincides or approximately coincides with a line segment farthest away from the first central axis Q among all the first line segments 1311 and all the third line segments 1321 (for example, the line segment is a third line segment 1321 on the lower left corner in FIG. 13, it can be understood that the embodiments of the present disclosure are not limited thereto, and in some other embodiments, the line segment may be a first line segment 1311). Here, "approximately coincide" means that there may be a small distance, e.g., a distance of several microns, between the second border E2 and the line segment farthest from the first central axis Q.

In this example, the area of the isolation block 140 may be set to be small, thus reducing the space occupation of the second fan-out region BB, realizing the signal shielding for the first line segment 1311 and the transfer line 134, and realizing the signal shielding for the third line segment 1321 and the transfer line 134. Therefore, it may be possible to avoid the signal crosstalk between the first line segment 1311 and the transfer line 134, avoid the signal crosstalk between the third line segment 1321 and the transfer line 134, and improve the brightness uniformity of the display substrate 100.

In some examples, an included angle between the first border E1 and the second border E2 is an obtuse angle. In this way, it is beneficial for the isolation block 140 to cover the first line segment 1311 and the third line segment 1321 that are obliquely arranged more completely, and thus it is conducive to avoiding signal crosstalk between the transfer line 134 and the first line segment 1311 and signal crosstalk between the transfer line 134 and the third line segment 1321.

In some examples, the orthographic projection of the isolation block 140 on the substrate is triangular or approximately triangular. For example, referring to FIG. 9, compared to a normal triangle, the orthographic projection, on the substrate, of the isolation block 140 shown in FIG. 9 lacks a large corner at the left end and a small corner at the right end. In this case, it may be considered that the orthographic projection is approximately triangular. It can be understood that, in other examples, the shape of the orthographic projection of the isolation block 140 on the substrate may also be set as a triangle or other approximate triangle. Here, other approximate triangle may include, for example, a case where sides of a triangle are sawtooth or wavy.

In this example, since the orthographic projection of the isolation block 140 on the substrate is triangular or approximately triangular, it is beneficial for the isolation block 140 to more completely cover the first line segments 1311 and the third line segments 1321 that are obliquely arranged, and it avoids signal crosstalk between the transfer line 134 and the first line segment 1311 and avoids signal crosstalk between the transfer line 134 and the third line segment 1321. Moreover, the area of the isolation block 140 may be set to be small, thus reducing the space occupation of the second fan-out region BB.

In some examples, the first line segment 1311, the second line segment 1312, the third line segment 1321 and the fourth line segment 1322 are located in at least two gate metal layers Gate (e.g., the first gate metal layer Gate1 and the second gate metal layer Gate2). The isolation block 140 is located in a source-drain metal layer close to the substrate 102 in the at least two source-drain metal layers SD (e.g., the first source-drain metal layer SD1), and the transfer line 134 is located in a source-drain metal layer far away from the substrate in the at least two source-drain metal layers (e.g., the second source-drain metal layer SD2 or the third source-drain metal layer SD3).

For example, in the fan-out sub-region, among the plurality of first line segments 1311 and the plurality of third line segments 1321, any two adjacent line segments (e.g., a first line segment 1311 and a third line segment 1321, or two first line segments 1311, or two second line segments 1321) are located in different gate metal layers (e.g., the first gate metal layer Gate1 and the second gate metal layer Gate2). In this way, it is conducive to reducing signal interference between the adjacent line segments (e.g., the first line segment 1311 and the third line segment 1321, or the two first line segments 1311, or the two second line segments 1321), and in turn improving the brightness uniformity of the display substrate.

For example, in the fan-out sub-region, any two adjacent transfer lines 134 are located in different source-drain metal layers SD (e.g., the second source-drain metal layer SD2 and the third source-drain metal layer SD3). In this way, it is conducive to reducing signal interference between the two adjacent transfer lines 134, and in turn improving the brightness uniformity of the display substrate.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a display region and a fan-out region, the fan-out region being adjacent to an edge of the display region, the display substrate comprising:

a substrate; and a plurality of conductive layers located on a same side of the substrate, the plurality of conductive layers being stacked;

the plurality of conductive layers including:

a plurality of data lines, wherein the plurality of data lines are arranged at intervals along a first direction, and the plurality of data lines all extend along a second direction, the second direction intersecting the first direction; the plurality of data lines include a plurality of first data lines and a plurality of second data lines, the plurality of first data lines are located in two edge regions of the display region along the first direction, and the plurality of second data lines are located in a central region of the display region along the first direction;

a plurality of connection lines, wherein a first end of a connection line of the plurality of connection lines is located in an edge region of the two edge regions and is electrically connected to a first data line of the plurality of first data lines, and a second end of the connection line extends to a boundary between the central region and the fan-out region; at least one of the plurality of connection lines crosses at least one data line, and is insulated from the at least one data line that the at least one of the plurality of connection lines crosses; a second end of the at least one of the plurality of connection lines is located between two adjacent second data lines; and a plurality of fan-out lines located in the fan-out region, wherein the plurality of fan-out lines include a plurality of first fan-out lines and a plurality of second fan-out lines; a first fan-out line is electrically connected to the second end of the connection line, and a second fan-out line is electrically connected to an end, proximate to the fan-out region, of a data line that is not electrically connected to the connection line;

wherein the display substrate further has a bending region and a chip on panel region that are sequentially away from the display region; the fan-out region includes a first fan-out region and a second fan-out region, the first fan-out region is located between the display region and the bending region, and the second fan-out region is located between the bending region and the chip on panel region;

the first fan-out line includes a transfer line, and the transfer line is located in the second fan-out region; the transfer line crosses at least one of the plurality of second fan-out lines, so that an arrangement order of ends of the plurality of fan-out lines away from the display region along the first direction is the same as an arrangement order of the plurality of data lines along the first direction;

wherein the transfer line includes a main body and two connection ends, and the main body is located on a side of the two connection ends proximate to the display region.

2. The display substrate according to claim 1, wherein the display substrate further has a cell test region located between the bending region and the chip on panel region; and the second fan-out region is located between the cell test region and the chip on panel region.

3. The display substrate according to claim 1, wherein the transfer line is U-shaped or approximately U-shaped.

4. The display substrate according to claim 1, wherein a central axis of the display substrate extending along the second direction is defined as a first central axis; a region located on a side of the first central axis in the second fan-out region is a fan-out sub-region; in the fan-out sub-region:

a plurality of transfer lines are arranged radially; wherein in two adjacent transfer lines, an outer transfer line is arranged around an inner transfer line.

5. The display substrate according to claim 4, wherein the two adjacent transfer lines are located in different conductive layers.

6. The display substrate according to claim 1, wherein a central axis of the display substrate extending along the second direction is defined as a first central axis; a region located on a side of the first central axis in the second fan-out region is a fan-out sub-region; in the fan-out sub-region:

the first fan-out line further includes a first line segment and a second line segment that are sequentially away from the display region and electrically connected to each other; the first line segment is gradually close to the first central axis from an end thereof proximate to the display region to an end thereof away from the display region; the second line segment is parallel to the first central axis;

the second fan-out line includes a third line segment and a fourth line segment that are sequentially away from the display region and electrically connected to each other; the third line segment is gradually close to the first central axis from an end thereof proximate to the display region to an end thereof away from the display region; the fourth line segment is parallel to the first central axis;

wherein a connection end of the transfer line proximate to the first central axis is electrically connected to an end of the second line segment away from the first line segment.

7. The display substrate according to claim 6, wherein in the fan-out sub-region:

a plurality of first line segments and a plurality of third line segments are alternately arranged; a fitting straight line defined by an end of the first line segment away from the display region and an end of the third line segment away from the display region is gradually close to the display region from an end thereof away from the first central axis to an end thereof proximate to the first central axis.

8. The display substrate according to claim 7, wherein in the fan-out sub-region:

second line segments that are directly adjacent among the plurality of second line segments are in a same group; and ends, away from the display region, of the second line segments in the same group are staggered along the first direction.

9. The display substrate according to claim 7, wherein the main body includes a first transfer segment;

the first transfer segment is connected to a connection end of the transfer line that is connected to the second line segment; an orthographic projection of the first transfer segment on the substrate overlaps with an orthographic projection of the corresponding connected second line segment on the substrate.

10. The display substrate according to claim 6, wherein in the fan-out sub-region:
second line segments that are directly adjacent among the plurality of second line segments are in a same group; and ends, away from the display region, of the second line segments in the same group are staggered along the first direction.

11. The display substrate according to claim 6, wherein in the fan-out sub-region:
in two adjacent second line segments, a length of a second line segment proximate to the first central axis is less than a length of a second line segment away from the first central axis;
in two adjacent transfer lines, a connection end of a transfer line proximate to the first central axis for connecting a second line segment is closer to the display region related to a connection end of a transfer line away from the first central axis for connecting a second line segment.

12. The display substrate according to claim 6, wherein the main body includes a first transfer segment;
the first transfer segment is connected to a connection end of the transfer line that is connected to the second line segment; an orthographic projection of the first transfer segment on the substrate overlaps or approximately overlaps with an orthographic projection of the corresponding connected second line segment on the substrate.

13. The display substrate according to claim 12, wherein the main body further includes a second transfer segment that is connected to the first transfer segment and a third transfer segment that is connected to the second transfer segment;
the plurality of conductive layers further include:
an isolation block located on a side of the first line segment and the third line segment away from the substrate, the isolation block covering the first line segment and the third line segment;
wherein the transfer line is located on a side of the isolation block away from the substrate; an orthographic projection of the second transfer segment on the substrate is located within an orthographic projection of the isolation block on the substrate; and
orthographic projections of the first transfer segment and the third transfer segment on the substrate are located outside the orthographic projection of the isolation block on the substrate.

14. The display substrate according to claim 13, wherein the isolation block is arranged in at least one of the following ways:
the isolation block is electrically connected to a voltage signal line; or
the isolation block includes a first border, and the first border coincides or approximately coincides with a fitting straight line defined by an end of the first line segment away from the display region and an end of the third line segment away from the display region; or
the isolation block includes a second border, and the second border coincides or approximately coincides with a line segment farthest away from the first central axis among all first line segments and all third line segments; or
the isolation block includes the first border and the second border, and an angle between the first border and the second border is an obtuse angle; or
the orthographic projection of the isolation block on the substrate is triangular or approximately triangular.

15. The display substrate according to claim 13, wherein the plurality of conductive layers include:
at least two gate metal layers; and
at least two source-drain metal layers located on a side of the at least two gate metal layers away from the substrate; wherein
the first line segment, the second line segment, the third line segment and the fourth line segment are located in the at least two gate metal layers, and the isolation block is located in a source-drain metal layer close to the substrate in the at least two source-drain metal layers, and the transfer line is located in a source-drain metal layer far away from the substrate in the at least two source-drain metal layers.

16. A display apparatus, comprising the display substrate according to claim 1.

17. The display apparatus according to claim 16, wherein a central axis of the display substrate extending along the second direction is defined as a first central axis; a region located on a side of the first central axis in the second fan-out region is a fan-out sub-region; in the fan-out sub-region:
a plurality of transfer lines are arranged radially; wherein among two adjacent transfer lines, an outer transfer line is arranged around an inner transfer line.

18. The display apparatus according to claim 16, wherein a central axis of the display substrate extending along the second direction is defined as a first central axis; a region located on a side of the first central axis in the second fan-out region is a fan-out sub-region; in the fan-out sub-region:
the first fan-out line further includes a first line segment and a second line segment that are sequentially away from the display region and electrically connected to each other; the first line segment is gradually close to the first central axis from an end thereof proximate to the display region to an end thereof away from the display region; the second line segment is parallel to the first central axis;
the second fan-out line includes a third line segment and a fourth line segment that are sequentially away from the display region and electrically connected to each other; the third line segment is gradually close to the first central axis from an end thereof proximate to the display region to an end thereof away from the display region; the fourth line segment is parallel to the first central axis;
wherein a connection end of the transfer line proximate to the first central axis is electrically connected to an end of the second line segment away from the first line segment.

19. The display apparatus according to claim 18, wherein in the fan-out sub-region:
a plurality of first line segments and a plurality of third line segments are alternately arranged; a fitting straight line defined by an end of the first line segment away from the display region and an end of the third line segment away from the display region is gradually close to the display region from an end thereof away from the first central axis to an end thereof proximate to the first central axis.

20. The display apparatus according to claim 18, wherein in the fan-out sub-region:
second line segments that are directly adjacent among the plurality of second line segments are in a same group;

and ends, away from the display region, of the second line segments in the same group are staggered along the first direction.

* * * * *